US011182236B2

(12) United States Patent
Vincelli et al.

(10) Patent No.: US 11,182,236 B2
(45) Date of Patent: Nov. 23, 2021

(54) PROBABILISTIC METRIC FOR RANDOM HARDWARE FAILURE

(71) Applicant: Renesas Electronics Corporation, Tokyo (JP)

(72) Inventors: Riccardo Vincelli, Duesseldorf (DE); Agostino Cefalo, Duesseldorf (DE)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/604,815

(22) PCT Filed: Apr. 13, 2017

(86) PCT No.: PCT/EP2017/058972
§ 371 (c)(1),
(2) Date: Oct. 11, 2019

(87) PCT Pub. No.: WO2018/188756
PCT Pub. Date: Oct. 18, 2018

(65) Prior Publication Data
US 2020/0081758 A1 Mar. 12, 2020

(51) Int. Cl.
*G06F 11/07* (2006.01)
*G06F 30/00* (2020.01)

(52) U.S. Cl.
CPC ........ *G06F 11/079* (2013.01); *G06F 11/0736* (2013.01); *G06F 11/0751* (2013.01); *G06F 30/00* (2020.01)

(58) Field of Classification Search
CPC . G06F 11/079; G06F 11/0751; G06F 11/0736
See application file for complete search history.

(56) References Cited

U.S. PATENT DOCUMENTS

| 7,516,025 B1 * | 4/2009 | Williams ........... G05B 23/0278 |
| | | 702/182 |
| 9,547,737 B2 * | 1/2017 | Vincelli ................. G06F 16/20 |
| | (Continued) | |

FOREIGN PATENT DOCUMENTS

EP    2757476 A1    7/2014

OTHER PUBLICATIONS

Das Nabarun, et al., "Quantified fault tree techniques for calculating hardware fault metrics according to ISO 26262," May 16, 2016, all enclosed pages cited.

(Continued)

*Primary Examiner* — Matthew M Kim
*Assistant Examiner* — Indranil Chowdhury
(74) *Attorney, Agent, or Firm* — Burr & Forman, LLP

(57) ABSTRACT

A method of determining a probabilistic metric for random hardware failure for an electronic system, such as a microcontroller, which comprises element and safety mechanisms (SMs) is disclosed. The safety mechanisms include first layer safety mechanisms (FL-SMs) and second layer safety mechanisms (SL-SMs). A first layer safety mechanism may provide at least partial coverage of failure of a part and a second layer safety mechanism may provide at least partial coverage of failure of a first layer safety mechanism. The method comprises calculating a first set of probabilities ($K_{SM\_i}$) associated with the first layer safety mechanisms, calculating a second set of probabilities ($K_{DVF\_n}$) associated with direct violation faults in the parts and calculating a third set of probabilities ($K_{IVF\_n}$) associated with indirect violation faults in the parts. The method includes obtaining the value of probabilistic metric for random hardware failure in dependence on the first, second and third sets of probabilities.

18 Claims, 17 Drawing Sheets

(56) References Cited

U.S. PATENT DOCUMENTS

| | | | | |
|---|---|---|---|---|
| 10,261,850 B2* | 4/2019 | Nicholas | ............ | G05B 23/0254 |
| 2005/0004833 A1* | 1/2005 | McRae | ................. | G05B 17/02 |
| | | | | 703/2 |
| 2008/0250265 A1* | 10/2008 | Chang | ................ | G06F 11/0709 |
| | | | | 714/4.12 |
| 2008/0256383 A1* | 10/2008 | Bose | .................... | G06F 11/008 |
| | | | | 714/1 |
| 2013/0317780 A1* | 11/2013 | Agarwal | ............ | G05B 23/0248 |
| | | | | 702/181 |
| 2014/0200699 A1* | 7/2014 | Vincelli | ................ | G06F 11/008 |
| | | | | 700/105 |
| 2014/0201565 A1* | 7/2014 | Candea | .............. | G06F 11/0727 |
| | | | | 714/6.2 |
| 2015/0033086 A1* | 1/2015 | Sasturkar | ................ | G06F 16/26 |
| | | | | 714/57 |
| 2019/0056981 A1* | 2/2019 | Shulkin | .............. | G11C 13/0035 |
| 2019/0278647 A1* | 9/2019 | Bakucz | .............. | G06F 11/0793 |
| 2020/0192737 A1* | 6/2020 | Kind | ....................... | G06F 17/18 |

OTHER PUBLICATIONS

Adler Nico, et al., "Rapid safety evaluation of hardware architectural designs compliantt with ISO 26262," Oct. 3, 2013, all enclosed pages cited.

ISO 26262-3:2011, "Road vehicles—Functional safety—Part 3: Concept phase," Nov. 15, 2011, all enclosed pages cited.

Hongkun Zhang, et al., "Model-based functional safety analysis method for automotive embedded system application," Aug. 13, 2010, all enclosed pages cited.

International Search Report and Written Opinion of PCT/EP2017/058972, dated Jan. 11, 2018, all enclosed pages cited.

\* cited by examiner

Example of a Fault Tree Analysis (FTA) branch

Example of an Basic Contribution (BC) timeline

Determine basic contributions
from FL-SMs

Calculate PMHF

| ID | Element name | Safety related | Fault Characterisation | Failure rate characteristic | IVF Concurrent |
|---|---|---|---|---|---|
| ... | ... | ... | ... | ... | ... |
| 10 | Element10 | y | Fault_charact_MEMORY | Failure rate_MEMORY | - |
| 11 | Element12 | y | Fault_charact_DIGITAL | Failure rate_DIGITAL | - |
| 12 | Element13 | y | Fault_charact_DIGITAL | Failure rate_DIGITAL | - |
| 13 | Element14 | y | Fault_charact_DIGITAL | Failure rate_DIGITAL | Element15 |
| 14 | Element15 | y | Fault_charact_DIGITAL | Failure rate_DIGITAL | - |
| 15 | Element16 | y | Fault_charact_DIGITAL | Failure rate_DIGITAL | Element13 |
| 16 | Element17 | n | Fault_charact_ANALOG_pwr | Failure rate_ANALOG_pwr | - |
| 17 | Element18 | y | Fault_charact_ANALOG_clk | Failure rate_ANALOG_clk | - |
| 18 | Element19 | y | | | |
| ... | ... | ... | | | |

Fig. 21

PROBABILISTIC METRIC FOR RANDOM HARDWARE FAILURE

FIELD OF THE INVENTION

The present invention relates to probabilistic metric for random hardware failure.

BACKGROUND

ISO26262-5 clause 9 proposes two, alternative methods of evaluating residual risk of a safety goal violation due to random hardware faults. One is a probabilistic metric called "probabilistic metric for random hardware failures" (PMHF) which involves evaluating violation of a safety goal using, for example, quantified Fault Tree Analysis (FTA) and comparing the result of the quantified values with a target value with the aim of evaluating whether the residual risk of safety goal violations is sufficiently low. The other involves individually evaluating each residual and single-point fault, and each dual-point failure leading to the violation of the considered safety goal.

The PMHF is the probability that an item will actually fail—and so violate its safety goal—due to random hardware faults. It takes into consideration contributing single point faults (SPFs), residual faults (RFs) and plausible dual point faults (DPFs) and also their time relation. The inclusion of dual point faults can lead to more complex functions of time.

In ISO26262-10, the PMHF is evaluated using a FTA approach, computing the probability that a fault occurs on a branch and combining, by summing up (through OR gates) or multiplying up (through AND gates), probabilities of all the faults to obtain the overall probability to have a hazard in the system under analysis.

The FTA approach can be represented using graphical symbols which can help make the analysis easier to understand. However, this approach can lead to very large trees and, because PMHF is evaluated by combining probabilities of all faults, to complex calculations which can be slow and involve considerable processing.

SUMMARY

According to a first aspect of the present invention there is provided a method of determining a probabilistic metric for random hardware failure for an electronic system, such as a microcontroller, which comprises elements and safety mechanisms (SMs). The safety mechanisms include first layer safety mechanisms (FL-SMs) and second layer safety mechanisms (SL-SMs). A first layer safety mechanism may provide at least partial coverage of failure of a part and a second layer safety mechanism may provide at least partial coverage of failure of a first layer safety mechanism. The method comprises calculating a first set of probabilities ($K_{SM\_i}$) associated with the first layer safety mechanisms, calculating a second set of probabilities ($K_{DVF\_n}$) associated with direct violation faults in the parts and calculating a third set of probabilities ($K_{IVF\_n}$) associated with indirect violation faults in the parts. The method includes obtaining the value of probabilistic metric for random hardware failure in dependence on the first, second and third sets of probabilities.

This can allow PMHF to be calculated more quickly using failure modes and effects analysis (FMEA)-like analysis.

A fault may be a direct violation fault (DVF) which, in the absence of any safety mechanism, has the potential to violate a safety goal directly. A fault which is categorized as being a direct violation fault and which is not covered by a safety mechanism can lead to an ISO 26262 single point fault (SPF) or an ISO 26262 residual fault (RF). A fault may be an indirect violation fault (IVF) which, only in combination with one or more other faults, has the potential to violate a safety goal. A fault which is categorized as being an indirect violation fault can lead to an ISO 26262 multiple point failure (MPF). A fault may be a no violation fault (NVF) which, even in combination with one or more other faults, does not have the potential to violate a safety goal. A fault which is categorized as being a no violation fault can be categorised as an ISO 26262 safe fault (SF).

The method may comprise storing the first, second and/or third sets of probabilities and/or storing the value of probabilistic metric for random hardware failure. The method may comprise displaying the value of probabilistic metric for random hardware failure. The method may further comprise outputting the value of probabilistic metric for random hardware failure.

The method may comprise automatically obtaining the value of probabilistic metric for random hardware failure. The method may comprise automatically outputting the value of probabilistic metric for random hardware failure.

Obtaining the value of probabilistic metric for random hardware failure may include adding the first, second and third sets of probabilities. Obtaining the value of probabilistic metric for random hardware failure may include dividing (i.e. dividing a result which includes adding the first, second and third sets of probabilities) by an estimated life time of the system ($T_{life}$).

The method may further comprise identifying a fourth set of failure rate contributions arising from the second layer safety mechanisms, wherein obtaining the value of probabilistic metric for random hardware failure including adding the first, second, third and fourth sets of failure rate contributions or wherein the first and second sets of failure rate contributions include the fourth set of failure rate contributions.

The value probabilistic metric for random hardware failure is preferably obtained in accordance with ISO 26262 standard.

The method may further comprise, for each first layer safety mechanism, determining whether a fault affecting a first layer safety mechanism is a direct violation fault or an indirect violation fault, determining whether the fault is covered by a second layer safety mechanism, in dependence upon the fault being covered by a second layer safety mechanism and establishing a link between the first layer safety mechanism and the second layer safety mechanism.

The method may further comprise, for each element, determining whether a fault affecting an element is a direct violation fault or an indirect violation fault, determining whether the fault is covered by a first layer safety mechanism, in dependence upon the fault being covered by a first layer safety mechanism and establishing a link between the part and the first layer safety mechanism.

Calculating the first set of probabilities may comprise, for each first layer safety mechanism, calculating a contribution due to a single direct violation fault in first layer safety mechanism and contributions due to combinations of a first fault occurring in a second layer safety mechanism and a later second, direct violation fault occurring in the first level safety mechanism.

Calculating the second set of probabilities comprises, for each part, calculating a contribution, if any, due to direct violation faults; and calculating a contribution, if any, due to indirect violation faults.

Calculating the second set of probabilities may comprise determining a contribution to the probabilistic metric for random hardware failure due to direct violation faults in parts. Calculating the second set of probabilities may comprise determining a contribution to the probabilistic metric for random hardware failure due to indirect violation faults in parts.

Calculating the third set of probabilities may comprise, for each part: determining whether the part is linked to another part and determining a contribution to the probabilistic metric for random hardware failure due to indirect violation faults for the part and the other part.

The electronic system may be an integrated circuit or a plurality of electronic components. For example, the integrated circuit may be a microcontroller. The microcontroller may be a microcontroller configured to be used in a vehicle chassis application. For instance, the microcontroller may include a FlexRay communication controller. The integrated circuit may be an application specific integrated circuit (ASIC). The plurality of electronic components include may include integrated circuit(s), discrete component(s), such as resistors, diodes, etc., MEMS device(s), sensor(s) and/or actuator(s).

According to a second aspect of the present invention there is provided a method of designing an electronic component. The method includes preparing a design of the electronic component, generating functional safety data for the first design of the electronic apparatus, and preparing a revised design of the electronic apparatus in dependence upon the functional safety data.

According to a third aspect of the present invention there is provided a method of fabricating an electronic component. The method comprises designing an electronic component and fabricating the electronic component according to the revised design.

According to a fourth aspect of the present invention there is provided a computer program which, when executed by data processing apparatus, causes the data processing apparatus to perform the method.

According to a fifth aspect of the present invention there is provided a computer program product (which may be non-transitory) comprising a computer-readable medium storing the computer program.

According to a sixth aspect of the present invention there is provided a design support system which includes data processing apparatus comprising at least one processor and at least one memory. The at least one processor is configured to perform the method.

According to a seventh aspect of the present invention there is provided an electronic system fabricated by the method of fabrication.

BRIEF DESCRIPTION OF THE DRAWINGS

Certain embodiments of the present invention will now be described, by way of example, with reference to the accompanying drawings, in which:

FIG. 21 is a schematic diagram of element characterisation data; and

DETAILED DESCRIPTION OF CERTAIN EMBODIMENTS

A process is herein described whereby values of PMHF can be obtained using FMEA-like analysis. This can be used to evaluate safety of an electronic system, such as an integrated circuit or a part thereof, more easily and/or quickly compared to using an FTA-like approach.

Figure 1:
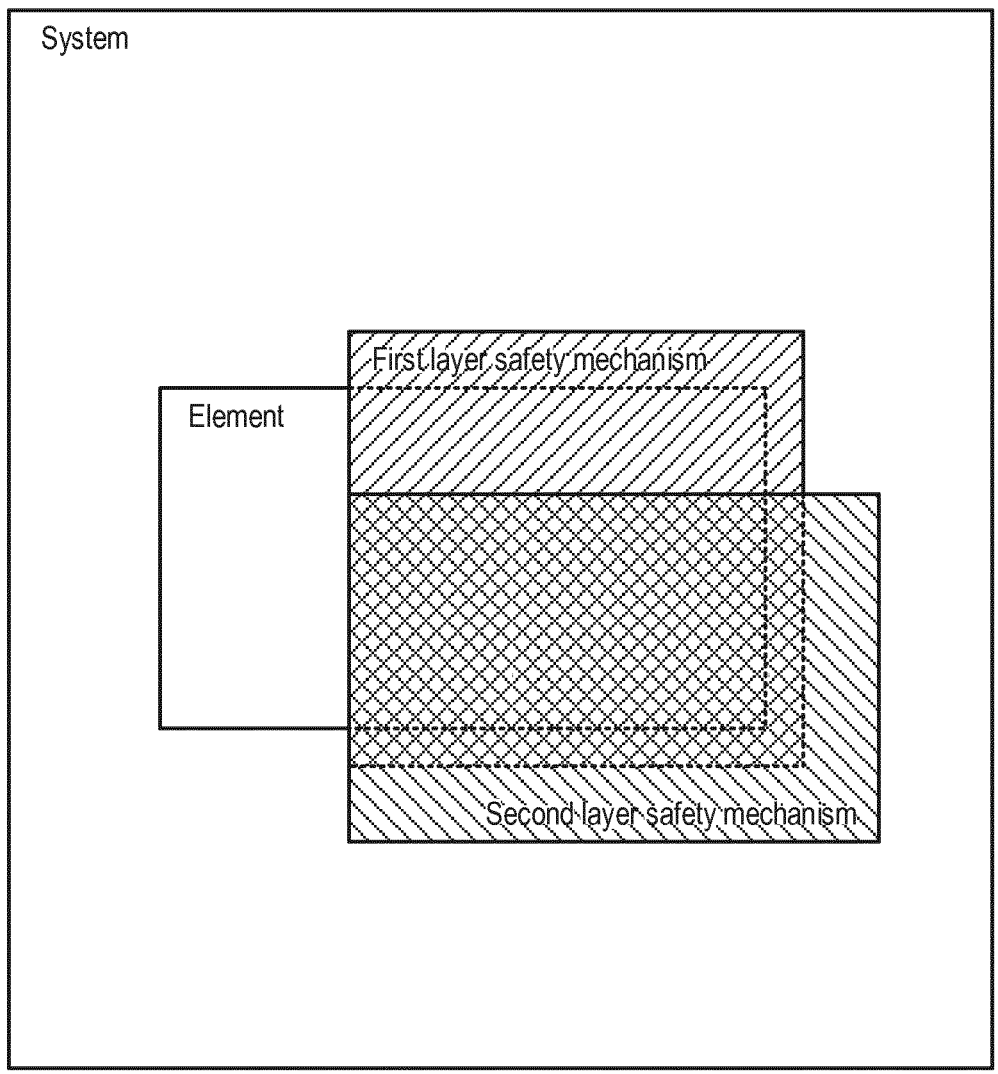
FIG. 1 schematically shows an element of an electronic system, a first layer safety mechanism (FL-SM) providing protection for a portion of the element and a second layer safety mechanism (SL-SM) providing protection for a portion of the first layer safety mechanism.

Referring to FIG. 1, an element (herein also referred to as a "part") which may comprise hardware is shown. The element is included in a system (such as an integrated circuit, for example, a microcontroller. An element can be, for example, a processing unit, volatile memory, non-volatile memory, data transfer units, various types of interface units, various types of communication units and timer units. The system may be provided with a plurality of safety mechanisms, each of which may be implemented in hardware, software or a combination of both. A safety mechanism (herein referred to a "first layer safety mechanism")

may provide coverage for all or a portion of the element. A safety mechanism (herein referred to a "second layer safety mechanism") may provide coverage for all or a portion of another safety mechanism. Functional safety analysis may be carried out to determine a PMHF value for the element, i.e. the probability that the element will fail (and so violate its safety goal) due to random hardware faults. This process involves considering a range of faults, such as SPFs, RFs and MPFs with n=2, taking into account safety mechanisms.

As an example, an element may be a main oscillator. A first layer safety mechanism may be provided in the form of a clock monitor. Such a clock monitor may provide partial control and detection ("C&D") coverage of the clock monitor. However, there may be no safety mechanism for the clock monitor, in other words, there is no second layer safety mechanism. A single or combination of faults that could lead to the violation of the safety goal include (1) any fault in an uncovered portion of the main oscillator linked to the fault and (2) a fault which renders the clock monitor unavailable, followed by a fault in a covered portion of the clock monitor. The uncovered portion of an element is linked to uncovered failure/fault.

Thus, safety analysis can be used can be used to break down the failure rates for the main oscillators into different lambda values.

The process is based on defining or using behavioural models herein referred to as "basic contributions" (BC) for each type of fault, such as SPFs, RFs and MPFs with n=2, deriving a probability of creating a hazard for each basic contribution and summing contributions to obtain an overall PMHF value. Each basic contribution can be represented a sequence of independent faults able to create a hazard and is characterized by a timeline showing the exact order of the faults. A basic contribution is the probability of the event (depicted in the timeline) occurring.

Figure 2A:
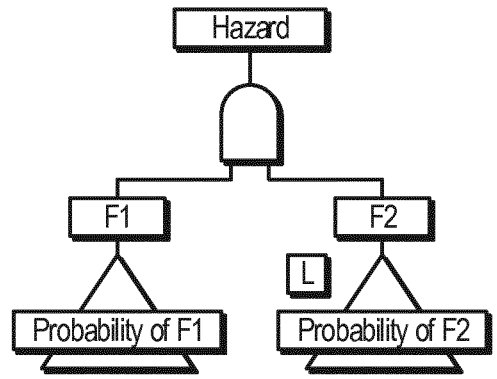
FIG. 2A illustrates an FTA branch for first and second faults.
Figure 2B:
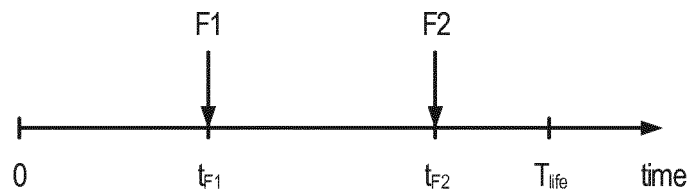
FIG. 2B shows a timeline for the first and second faults shown in FIG. 1A.

FIGS. 2A and 2B respectively show an example of an FTA branch and a corresponding timeline for first and second faults F1, F2 for a basic contribution. The two ways of illustrating and describing a basic contribution are interchangeable.

In the illustrated example, the second fault F2 will only create a hazard if it occurs after the first fault F1. When using an FTA branch representation, this order is indicated using a letter 'L' in a box on the left-hand side of the second fault F2. Thus, in this example, the second fault F2 must be the last one to occur for the hazard to arise. Thus, an FTA branch can be replaced by a corresponding basic contribution.

Descriptions of various basic contributions are hereinafter described.

The process is based on a set of assumptions and a plurality of fault sets. An example set of assumptions and examples of fault sets are set out in Tables 1 and 2 respectively. The assumptions may be modified. For example, other assumptions may be used.

TABLE 1

| ID | Assumption | Description |
|----|------------|-------------|
| 1 | Only one SM acting on the same fault | If more than one SM is covering the same fault, only the best SM (i.e. offering the highest coverage of a failure) is actually considered for the calculation of the PMHF |
| 2 | SL-SM executes tests periodically | Second layer of SM is not continuously available to check the functionalities of a first layer safety mechanism (FL-SM), for example, a key-on test; SL-SM performs tests every $\tau$. |
| 3 | Faults in a SL-SM can only be IVF | There will be no direct contribution to the PMHF from SL-SM; portion of failures in time (FIT) associated to them is only be considered contribution due to parts covered by the SM itself |
| 4 | There is no possibility of having a hazard due to multiple faults affecting the same part | Even if a part is hit by two different IVF faults, this will not lead to a hazard |
| 5 | SL-SM is only able of doing detection | There is no possibility that a second layer SM can correct or mask faults; it is assumed to be able only to detect the occurrence of a fault and flag it to the upper application layer |
| 6 | $T_{life}$ is an integer number of time $\tau$ (i.e. $T_{life} = k\tau$, $k = 1, 2, 3, \ldots$) | This assumption is used to ease the calculation of contribution due to SMs performing tests on a regular time base |
| 7 | There is no possibility of having a hazard due to a group of three or more faults | Contributions arising from three or more different IVF faults are excluded from consideration |
| 8 | No contribution from software safety mechanisms | Consideration of software-based safety mechanisms are not considered |

TABLE 2

| ID | Descriptive sets of faults | Description | Associated portion of FIT |
|----|---------------------------|-------------|---------------------------|
| 1 | Pa_DVF_U_U | set of direct violation fault (DVF) faults in part $P_a$ not covered by any SM | $\lambda_{Pa\_DVF\_U\_U}$ |
| 2 | Pa_DVF_Di_U | set of DVF faults in part $P_a$ detected (and controlled) by FL-SMi whose faults are not covered by any other SM | $\lambda_{Pa\_DVF\_Di\_U}$ |

TABLE 2-continued

| ID | Descriptive sets of faults | Description | Associated portion of FIT |
|---|---|---|---|
| 3 | Pa_DVF_Di_Dj | set of DVF faults in part $P_a$ detected (and controlled) by FL-SMi whose faults are in turn covered by SL-SMj | $\lambda_{Pa\_DVF\_Di\_Dj}$ |
| 4 | Pa_DVF_Ci_U | set of DVF faults in part $P_a$ controlled-only by FL-SMi whose faults are not covered by any other SM | $\lambda_{Pa\_DVF\_Ci\_U}$ |
| 5 | Pa_DVF_Ci_Dj | set of DVF faults in part $P_a$ controlled-only by FL-SMi whose faults are in turn covered by SL-SMj | $\lambda_{Pa\_DVF\_Ci\_Dj}$ |
| 6 | Pa_IVF_U_U | set of IVF faults in part $P_a$ not covered by any SM | $\lambda_{Pa\_IVF\_U\_U}$ |
| 7 | Pa_IVF_Ci_U | set of IVF faults in part $P_a$ controlled-only by FL-SMi whose faults are not covered by any other SM | $\lambda_{Pa\_IVF\_Ci\_U}$ |
| 8 | Pa_IVF_Ci_Dj | set of IVF faults in part $P_a$ a controlled-only by FL-SMi whose faults are in turn covered by SL-SMj | $\lambda_{Pa\_IVF\_Ci\_Dj}$ |
| 9 | Pa_IVF_Di_U | set of IVF faults in part $P_a$ detected by FL-SMi whose faults are not covered by any other SM | $\lambda_{Pa\_IVF\_Di\_U}$ |
| 10 | Pa_IVF_Di_Dj | set of IVF faults in part $P_a$ detected by FL-SMi whose faults are in turn covered by SL-SMj | $\lambda_{Pa\_IVF\_Di\_Dj}$ |
| 11 | FL-SMi_DVF_U | set of DVF faults in FL-SMi not detected by any SM | $\lambda_{FL-SMi\_DVF\_U}$ |
| 12 | FL-SMi_DVF_Dj | set of DVF faults in FL-SMi detected by SL-SMj | $\lambda_{FL-SMi\_DVF\_Dj}$ |
| 13 | FL-SMi_IVF_U | set of IVF faults in FL-SMi not detected by any SM | $\lambda_{FL-SMi\_IVF\_U}$ |
| 14 | FL-SMi_IVF_Dj | set of IVF faults in FL-SMi detected by SL-SMj | $\lambda_{FL-SMi\_IVF\_Dj}$ |
| 15 | SL-SMj | all faults affecting SL-SMj | $\lambda_{SL-SMj}$ |

The indices 'i' and 'j' are used to address first layer safety mechanisms (or "FL-SMs") and second layer safety mechanisms (or "SL-SMs") respectively. The indices are intended to create an unambiguous link between a part (or an FL-SM) and its corresponding safety mechanism. Examples of a part include, for example, a CPU core, embedded memory or a communication unit which may be included in a microcontroller or other integrated circuit.

In the following, attention may be given to a single first layer safety mechanisms (or second layer safety mechanisms) for the sake of simplicity. In reality, however, faults affecting a part can be covered by more than one safety mechanism and in turn fault in a first layer safety mechanisms can be covered by more than one second layer safety mechanisms. Thus, even if the description refers to a single safety mechanism per time, the process can consider the possibility of two or more safety mechanisms acting together.

The sets introduced in Table 2 are simplified examples intended to simply the descriptions of the basic contributions described hereinafter. For example, sets "Pa_DVF_Di_Dj" and "Pa_DVF_Di_U" may have no meaning because a fault in part $P_a$ is covered by FL-SMi in full, not by a part of it. Thus, the fault is covered by all of the sub part of a FL-SM. In other words, a more practical application, a single set, namely Pa_DVF_Di, can be used which include both sets. The sets presented in Table 2 are intended to help provide a better understanding of how to use basic contributions. An actual evaluation of the PMHF is done using sets described in Table 5.

Definition of Basic Contributions

Figure 3:
FIG. 3 shows a timeline for a fault.

Formulas in this section are derived from Probability Theory. For the sake of simplicity, in this section, the following names and symbols are used:

$F_i$ fault i
$\lambda_i$ portion of FIT (or "failure rate") associated to $F_i$
$t_{Fi}$ instant at which $F_i$ occurs
$T_{life}$ estimated life time of the item under analysis
$\tau$ estimated time span between two different tests of the first layer SM by a possible second layer SM (herein also referred to as "test interval")
FTT Fault Tolerant Time
$BC_{single}$
$BC_{single}$ is the contribution to the PMHF of a single fault not covered by any SM, which can occur during the whole life-time. FIG. 3 shows the timeline of this contribution. From Probability Theory, it is possible to evaluate the quantitative contribution to the PMHF of $BC_{single}$ using Formula 1, namely:

$$BC_{single}(\lambda_{F1}) = \int_0^{T_{life}} \lambda_{F1} dt = \lambda_{F1} T_{life} \qquad (1)$$

Example: a DVF fault not covered by any SM can create a hazard at any time during the whole life time of a car. Its contribution to the PMHF can be then evaluated using Formula 1. Considering a whole part that can be affected by DVF faults, this contribution has to be evaluated for each fault; the result is expressed by Formula 2, namely $$BC_{single}(\lambda_{Pa\_DVF\_U\_U}) = \sum_{F_n \in \{Pa\_DVF\_U\_U\}} BC_{single}(\lambda_{F_n}) = \lambda_{Pa\_DVF\_U\_U} T_{life} \qquad (2)$$

BC$_{double\_ord}$

Figure 4:
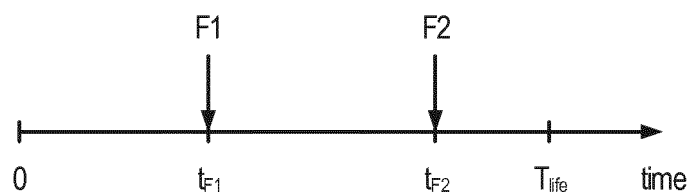
FIG. 4 shows a timeline for two faults whose order is relevant.

BC$_{double\_ord}$ is the contribution of two faults occurring in an ordered sequence, namely a first fault F1 occurring first and then a second fault F2 occurring. FIG. 4 shows the timeline of this contribution. From Probability Theory, it is possible to evaluate the quantitative contribution to the PMHF of BC$_{double\_ord}$ using Formula 3, namely:

$$BC_{double\_ord}(\lambda_{F1}, \lambda_{F2}) = \int_0^{T_{life}} \left( \int_0^t \lambda_{F1} \lambda_{F2} dx \right) dt = \lambda_{F1} \lambda_{F2} \frac{T_{life}^2}{2} \quad (3)$$

The order of the arguments ($\lambda_{F1}$, $\lambda_{F2}$) in Formula 3 is the same in the sequence of the faults for the hazard to occur. It is noted that the formula involves multiplication and so the order of the terms is not relevant.

Example: a DVF fault covered by a safety mechanism able of control and detection (also referred to as "C&D" or simply as "CD") can only create a hazard if the safety mechanism becomes unavailable before the fault occurs. The sequence of faults resulting in a hazard in this case is shown in FIG. 4 where the first fault F1 is the fault that causes the safety mechanism to become unavailable and the second fault F2 is the DVF fault.

For each single DVF fault affecting a part, this contribution has to be evaluated for all the faults that make the safety mechanism unavailable. The result is expressed by Formula 4:

$$BC_{double\_ord}(\lambda_{FL-SM_i\_IVF\_U}, \lambda_{Pa\_DVF\_D_i\_U}) == \quad (4)$$

$$\sum_{F\_P_n \in \{Pa\_DVF\_D_i\_U\}} \left[ \sum_{F\_FL-SM_m \in \{FL-SM_i\_IVF\_U\}} BC_{double\_ord} \right.$$

$$\left. (\lambda_{F\_FL-SM_m}, \lambda_{F\_P_n}) \right] == \lambda_{FL-SM_i\_IVF\_U} \lambda_{Pa\_DVF\_D_i\_U} \frac{T_{life}^2}{2}$$

BC$_{double\_unord}$

Figure 5:
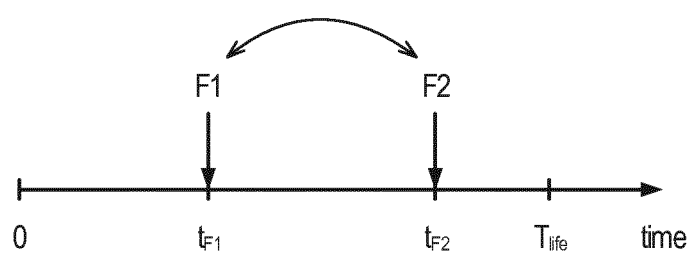
FIG. 5 shows a timeline for two faults whose order is not relevant.

BC$_{double\_unord}$ is the contribution of two faults occurring without any restriction on their sequence. FIG. 5 shows the timeline of this contribution. The double-headed arrow between the faults shows that the faults can be swapped as the order of their occurrence is not relevant. From Probability Theory, it is possible to evaluate the quantitative contribution to the PMHF of BC$_{double\_unord}$ using Formula 5:

$$BC_{double\_unord}(\lambda_{F1}, \lambda_{F2}) = \int_0^{T_{life}} \left( \int_0^{T_{life}} \lambda_{F1} \lambda_{F2} dx \right) dt = \lambda_{F1} \lambda_{F2} T_{life}^2 \quad (5)$$

Example: a DVF fault covered by a safety mechanism providing control but no detection can create a hazard if either one of the following conditions is met, namely (1) the safety mechanism is made unavailable before the fault occurs and (2) the safety mechanism is made unavailable after the fault in P has occurred (and so it has been controlled remaining latent). Both conditions are shown by FIG. 5 and Formula 5 represents this case.

For each DVF fault affecting a part, this contribution has to be evaluated for all the faults that make the safety mechanism unavailable; the result is expressed by Formula 6:

$$BC_{double\_unord}(\lambda_{FL-SM_i\_IVF\_U}, \lambda_{Pa\_DVF\_C_i\_U}) == \quad (6)$$

$$\sum_{F\_P_n \in \{Pa\_DVF\_C_i\_U\}} \left[ \sum_{F\_FL-SM_m \in \{FL-SM_i\_IVF\_U\}} BC_{double\_ord} \right.$$

$$\left. (\lambda_{F\_FL-SM_m}, \lambda_{F\_P_n}) \right] == \lambda_{FL-SM_i\_IVF\_U} \lambda_{Pa\_DVF\_C_i\_U} T_{life}^2$$

BC$_{tau}$

Figure 6:
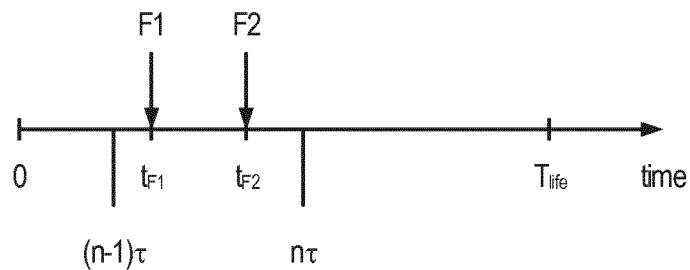
FIG. 6 shows a timeline for two faults whose order is relevant and which occur in a time span τ.

BC$_{tau}$ is the contribution of two faults occurring in an ordered sequence in a limited time span τ. This basic contribution is similar to BC$_{double\_ord}$, the difference being that there is time span in which this contribution is made possible. FIG. 6 shows the timeline of the sequence of the faults for this contribution. From Probability Theory, it is possible to evaluate the quantitative contribution to the PMHF of BC$_{tau}$ using Formula 7:

$$BC_{tau}(\lambda_{F1}, \lambda_{F2}) = \int_0^{\tau} \left( \int_0^t \lambda_{F1} \lambda_{F2} dx \right) dt = \lambda_{F1} \lambda_{F2} \frac{\tau^2}{2} \quad (7)$$

Example: this is one of the possible ways in which a DVF fault controlled (and possibly detected) by a FL-SM, which is in turn monitored by a SL-SM (executing a test every r), can cause a hazard.

In between two consecutive tests performed by the SL-SM, there is no way of being aware if a fault (F1) has occurred and made the FL-SM unavailable. So if another fault occurs in the part within the same time span, then there will be a hazard.

For this contribution, the possibility that SL-SM is not available has not been considered since, due to the periodic nature of the SL-SM (see Table 1), the sequence of faults shown in FIG. 5 is able to lead to the hazard regardless of whether the SL-SM is correctly working or not.

Formula 8 gives the overall BC$_{tau}$ contribution, considering all the faults affecting the part and the safety mechanism:

$$BC_{tau}(\lambda_{FL-SM_i\_IVF\_D_j}, \lambda_{Pa\_DVF\_D_i\_D_j}) == \quad (8)$$

$$\sum_{F\_P_n \in \{Pa\_DVF\_D_i\_D_j\}} \left[ \sum_{F\_FL-SM_m \in \{FL-SM_i\_IVF\_D_j\}} BC_{tau}(\lambda_{F\_FL-SM_m}, \right.$$

$$\left. \lambda_{F\_P_n}) \right] == \lambda_{FL-SM_i\_IVF\_D_j} \lambda_{Pa\_DVF\_D_i\_D_j} \frac{\tau^2}{2}$$

BC$_{test}$

Figure 7:
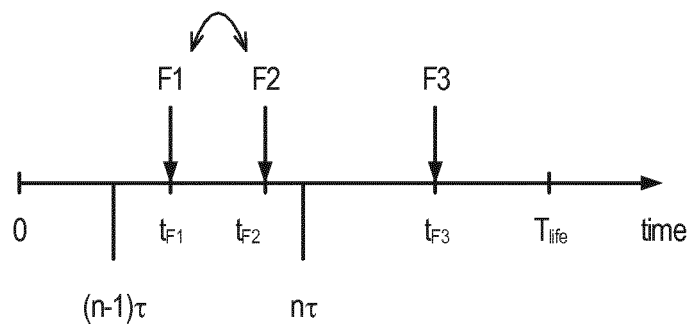
FIG. 7 shows a timeline for three faults including first and second faults whose order is not relevant and which occur in a time span, and a third fault occurs after the end of the time span.

BC$_{test}$ is the contribution of three faults occurring with particular time constraints: the first and the second faults F1, F2 have to occur within the same time interval [(n−1)τ, nτ] while the third fault F3 has to occur after t$_{F3}$>nτ. The order of occurrence of the first and second faults F1, F2 can be reversed. FIG. 7 shows the timeline of the sequence of the faults for this contribution. From the Probability Theory, it is possible to evaluate the quantitative contribution to the PMHF of BC$_{test}$ using Formula 9:

$$BC_{test}(\lambda_{F1}, \lambda_{F2}, \lambda_{F3}) = \lambda_{F1}\lambda_{F2}\lambda_{F3}\tau^2 \frac{T_{life}}{2}\left(\frac{T_{life}}{\tau} - 1\right) \quad (9)$$

Example: this is another possible way in which a DVF fault controlled by a FL-SM which is in turn monitored by a SL-SM (executing a test every τ) can cause a hazard, unrelated from the previous one.

If both first layer and second layer safety mechanisms are made unavailable within the same test interval [(n−1)τ, nτ], then there will be no possibility to be aware that the first layer safety mechanism is no longer working and so any fault occurring in P will not be covered, causing then the hazard. Formula 10 gives the overall $BC_{test}$ contribution related to a part, its related first layer and second layer safety mechanisms in whole:

$$BC_{test}(\lambda_{SL-SM_j}, \lambda_{FL-SM_i\_IVF\_D_j}, \lambda_{Pa\_DVF\_D_i\_D_j}) == \quad (10)$$

$$\sum_{F\_P_n \in \{Pa\_DVF\_D_i\_D_j\}} \left[ \sum_{F\_FL-SM_m \in \{FL-SM_i\_IVF\_D_j\}} \left( \sum_{F\_SM_k \in \{SL-SM_j\}} BC_{test} \right.\right.$$

$$(\lambda_{F\_SL-SM_k}, \lambda_{F\_FL-SM_m}, \lambda_{F\_P_n}) \bigg) \bigg] ==$$

$$\lambda_{SL-SM_j}\lambda_{FL-SM_i\_IVF\_D_j}\lambda_{Pa\_DVF\_D_i\_D_j} \frac{\tau^2 T_{life}}{2}\left(\frac{T_{life}}{\tau} - 1\right)$$

Figure 8:
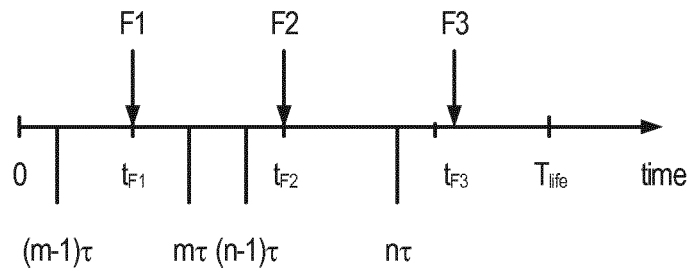
FIG. 8 shows a timeline for three faults including a first fault which occurs in a first time span, a second fault which occurs in a second time span which occurs after the end of the first time span and a third fault which occurs after the end of the second time span.

$BC_{cascade}$ $BC_{cascade}$ is the contribution of three faults occurring with the following sequence: a first fault F1 occurring in the interval [(m−1)τ, mξ], a second fault F2 occurring at $t_{F2} \in$ [(n−1)τ, nτ], n>m, and a third fault F3 occurring at $t_{F3}$>nτ. FIG. 8 shows the timeline of sequence of the fault generating this contribution. From the Probability Theory, it is possible to evaluate the quantitative contribution to the PMHF of $BC_{cascade}$ using Formula 11:

$$BC_{cascade}(\lambda_{F1}, \lambda_{F2}, \lambda_{F3}) = \lambda_{F1}\lambda_{F2}\lambda_{F3}\left(\frac{T_{life}^3}{6} - \frac{\tau}{2}T_{life}^2 + \frac{\tau^3}{3}T_{life}\right) \quad (11)$$

Example: this is again a possible way in which a DVF fault controlled by a FL-SM which is in turn monitored by a SL-SM (executing a test every τ) can cause a hazard, unrelated from the previous ones.

If the SL-SM is the first to be made unavailable (F1), any fault occurring in FL-SM (F2) cannot be detected so that if the DVF fault occurs (F3) it will cause the hazard. It is noted that the third fault F3 cannot occur in the interval [(n−1)τ, nτ] as the second fault F2 otherwise $BC_{cascade}$ will not be unrelated from $BC_{tau}$. Formula 12 gives the overall $BC_{cascade}$ contribution related to a part, its related first layer and second layer safety mechanisms in whole:

$$BC_{cascade}(\lambda_{SL-SM_j}, \lambda_{FL-SM_i\_IVF\_D_j}, \lambda_{Pa\_DVF\_D_i\_D_j}) == \quad (12)$$

$$\sum_{F\_P_n \in \{Pa\_DVF\_D_i\_D_j\}} \left[ \sum_{F\_FL-SM_m \in \{FL-SM_i\_IVF\_D_j\}} \left( \sum_{F\_SM_k \in \{SL-SM_j\}} \right.\right.$$

$$BC_{cascade}(\lambda_{F\_SL-SM_k},$$

$$\lambda_{F\_FL-SM_m}, \lambda_{F\_P_n}) \bigg) \bigg] ==$$

$$\lambda_{SL-SM_j}\lambda_{FL-SM_i\_IVF\_D_j}\lambda_{Pa\_DVF\_D_i\_D_j}\left(\frac{T_{life}^3}{3} - T_{life}^2\tau + \frac{2}{3}T_{life}\tau^2\right)$$

$BC_{2Layers}$

In the case where both first layer and second layer safety mechanisms are carrying out detection only their total probability of leading to a hazard can be calculated as the combination of the 3 unrelated events $BC_{tau}$, $BC_{test}$ and $BC_{cascade}$. Consequently, as the three basic layers are used together, a new contribution ("$BC_{2layers}$"), described in Formula 13, can be defined as their sum:

$$BC_{2Layers}(\lambda_{F1},\lambda_{F2},\lambda_{F3}) = BC_{tau}(\lambda_{F1},\lambda_{F2}) + BC_{test}(\lambda_{F1}, \lambda_{F2},\lambda_{F3}) + BC_{cascade}(\lambda_{F1},\lambda_{F2},\lambda_{F3}) \quad (13)$$

Application of BCs

In a safety analysis process, the PMHF can be calculated by summing all the combinations of basic contributions, related to all the disjoint or unrelated events that can cause a hazard derived from any kind of fault (either DVF or IVF) which may be covered by a FL-SM with control and/or detection ability which, in turn, may or may not be monitored by a SL-SM.

Table 3 shows which basic contributions are taken into account to evaluate the PMHF for each set of DVF faults. IVF faults are considered in Table 4. For a detailed description of the faults sets, please refer again to Table 2.

TABLE 3

| ID | Descriptive sets | PMHF contribution |
|---|---|---|
| 1 | Pa_DVF_U_U | $BC_{single}(\lambda_{Pa\_DVF\_U\_U})$ |
| 2 | Pa_DVF_Di_U | $BC_{double\_ord}(\lambda_{FL-SMi\_IVF\_U}, \lambda_{Pa\_DVF\_Di\_U})$ |
| 3 | Pa_DVF_Di_Dj | $BC_{2Layers}(\lambda_{Pa\_DVF\_Di\_Dj}, \lambda_{FL-SMi\_IVF\_Dj}, \lambda_{SL-SMj})$ |
| 4 | Pa_DVF_Ci_U | $BC_{double\_unord}(\lambda_{FL-SMi\_IVF\_U}, \lambda_{Pa\_DVF\_Ci\_U})$ |
| 5 | Pa_DVF_Ci_Dj | $BC_{2Layers}(\lambda_{Pa\_DVF\_Ci\_Dj}, \lambda_{FL-SMi\_IVF\_Dj}, \lambda_{SL-SMj})$ + $BC_{double\_ord}(\lambda_{Pa\_DVF\_Ci\_Dj}, \lambda_{FL-SMi\_IVF\_Dj})$ |
| 6 | FL-SMi_DVF_U | $BC_{single}(\lambda_{FL-SMi\_DVF\_U})$ |
| 7 | FL-SMi_DVF_Dj | $BC_{double\_ord}(\lambda_{SL-SMj}, \lambda_{FL-SMi\_DVF\_Dj})$ |
| 8 | FL-SMi_IVF_U | NONE: effect of these faults is taken into account when evaluating contributions due to the part covered by the SM, then no direct contribution to PMHF from them |
| 9 | FL-SMi_IVF_Dj | |
| 10 | SL-SMj | NONE: assumption is that a SL-SMj is not able to create a hazard. |

The term "$BC_{double\_ord}(\lambda_{Pa\_DVF\_Ci\_Dj}, \lambda_{FL-SMi\_IVF\_Dj})$" in ID 5 is needed because of the control-only ability of FL-SMi. If a fault occurs in Pa, then it is controlled but not notified by FL-SMi. If, after that, a fault makes FL-SMi unavailable, the hazard is created independently of SL-SMj. A conservative assumption is that FTT for DVF is 0.

Examples provided in the description of the basic contributions hereinbefore described are sufficient to explain the other items in Table 3.

Figure 9:
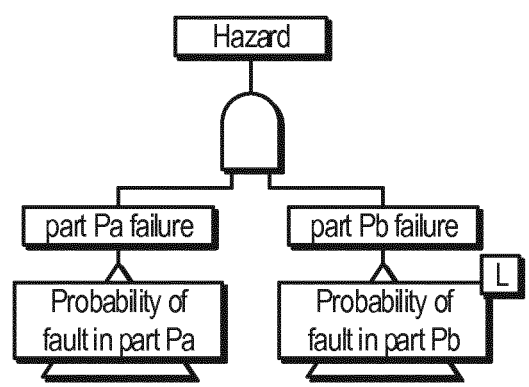
FIG. 9 illustrates an FTA branch for first and second indirect violation fault (IVF) faults.

Referring to FIG. 9, in an FTA approach, the contribution to the PMHF due to two independent IVF faults is evaluated by multiplying (i.e. combining through an AND gate) the results of the two branches related to the two faults. As a result of the similarity between the FTA approach and the approach herein described, it is possible by extension to compute the contribution from IVF faults as set out in Table 4.

the cases, this is such that the SL-SM is just able to detect unavailability of FL-SM. By detecting unavailability of the FL SM, the hazard is avoided and so this contribution can be neglected and the introduction of the term "$BC_{double\_ord}(\lambda_{Pa\_IVF\_Ci\_Dj}, \lambda_{FL-SMi\_IVF\_Dj})$" in this case is even more conservative than for the DVF one.

Referring still to Table 4, the formula for $K_{Pb}$ in the column "Notes" has been written in its most generic way, considering all the possible combination of SMs (both FL and SL type) acting on its IVF faults. It is noted that if a set of faults is not present in the part $P_b$, the related portion of FIT is 0 as well as the associated BC.

If, for instance, in part $P_b$, there are no faults detected by a FL-SM, both $\lambda_{Pb\_IVF\_Dh\_U}$ and $\lambda_{Pb\_IVF\_Dh\_Dv}$ are equal to 0 and consequently are equal to 0 also the BCs using those $\lambda$ ($BC_{double\_ord}(\lambda_{FL-SMh\_IVF\_U\_U}, \lambda_{Pb\_IVF\_Dh\_U})$, $BC_{2Layers}(\lambda_{Pb\_IVF\_Dh\_Dv}, \lambda_{FL-SMh\_IVF\_Dv}, \lambda_{SL-SMv})$). Once

TABLE 4

| Descriptive sets of faults | PMHF contribution | Notes |
|---|---|---|
| Pa_IVF_U_U | $0.5 * BC_{single}(\lambda_{Pa\_IVF\_U\_U}) * K_{Pb}$ | $K_{Pb} = BC_{single}(\lambda_{Pb\_IVF\_U\_U}) + +$ |
| Pa_IVF_Ci_U | $0.5 * BC_{double\_unord}(\lambda_{FL-SMi\_IVF\_U}, \lambda_{Pa\_IVF\_Ci\_U}) * K_{Pb}$ | $BC_{double\_ord}(\lambda_{FL-SMh\_IVF\_U\_U}, \lambda_{Pb\_IVF\_Dh\_U}) +$ |
| Pa_IVF_Ci_Dj | $0.5 * [BC_{2Layers}(\lambda_{Pa\_IVF\_Ci\_Dj}, \lambda_{FL-SMi\_IVF\_Dj}, \lambda_{SL-SMj}) + BC_{double\_ord}(\lambda_{Pa\_IVF\_Ci\_Dj}, \lambda_{FL-SMi\_IVF\_Dj})]* K_{Pb}$ | $BC_{double\_unord}(\lambda_{Pb\_IVF\_Ch\_U}, \lambda_{FL-SMh\_IVF\_U}) + BC_{2Layers}(\lambda_{Pb\_IVF\_Dh\_Dv}, \lambda_{FL-SMh\_IVF\_Dv}, \lambda_{SL-SMv}) +$ $BC_{2Layers}(\lambda_{Pb\_IVF\_Ch\_Dv}, \lambda_{FL-SMh\_IVF\_Dv}, \lambda_{SL-SMv}) + +$ |
| Pa_IVF_Di_U | $0.5 * BC_{double\_ord}(\lambda_{FL-SMi\_IVF\_U}, \lambda_{Pa\_IVF\_Di\_U}) * K_{Pb}$ | $BC_{double\_ord}(\lambda_{Pb\_IVF\_Ch\_Dv}, \lambda_{FL-SMh\_IVF\_Dv})$ |
| Pa_IVF_Di_Dj | $0.5 * BC_{2Layers}(\lambda_{Pa\_IVF\_Di\_Dj}, \lambda_{FL-SMi\_IVF\_Dj}, \lambda_{SL-SMj}) * K_{Pb}$ | |

In Table 4, indices 'h' and 'v' are used to address the FL-SM and the SL-SM respectively related to part $P_b$. Bearing this change in mind, Table 2 can still be used to describe sets of faults related to part $P_b$.

In Table 4, each formula contains a factor 0.5. This is introduced to avoid an overestimation of contributions due to IVF faults. Considering the example of the above table, the overall contribution to the PMHF due to IVF faults in parts $P_a$ and $P_b$ ($K_{Pa\_Pb}$) is:

$K_{Pa\_Pb} = K_{IVF\_a} \cdot K_{IVF\_b}$

It can be easily seen that summing all contributions related to Pa (column "PMHF contribution" in the Table 4), the result ($K_{IVF\_a}$) is:

$K_{IVF\_a} = 0.5 \cdot K_{Pa} \cdot K_{Pb}$

Such a sum is also done for $P_b$ ($K_{IVF\_b}$) to obtain also:

$K_{IVF\_b} = 0.5 \cdot K_{Pb} \cdot K_{Pa}$

The overall contribution can then be evaluated as:

$K_{Pa\_Pb} = K_{IVF\_a} + K_{IVF\_b} = 0.5 \cdot K_{Pa} \cdot K_{Pb} + 0.5 \cdot K_{Pb} \cdot K_{Pa} = K_{Pa} \cdot K_{Pb}$ Referring to Table 4 above, in the case of IVF, there is a bigger FTT than in the case of DVF and, in the majority of all the basic contributions have been evaluated for the whole design, it is possible to compute the total PMHF value by summing all the basic contributions, as set out in Formula 14 where $K_{IVF}$ takes into account contributions due to parts affected by IVF faults:

$$PMHF = \Sigma BC_{single} + \Sigma BC_{double\_ord} + \Sigma BC_{double\_unord} + \Sigma BC_{2Layers} + \Sigma BC_{IVF} \quad (14)$$

Integration into Safety Analysis Flow

Figure 10:
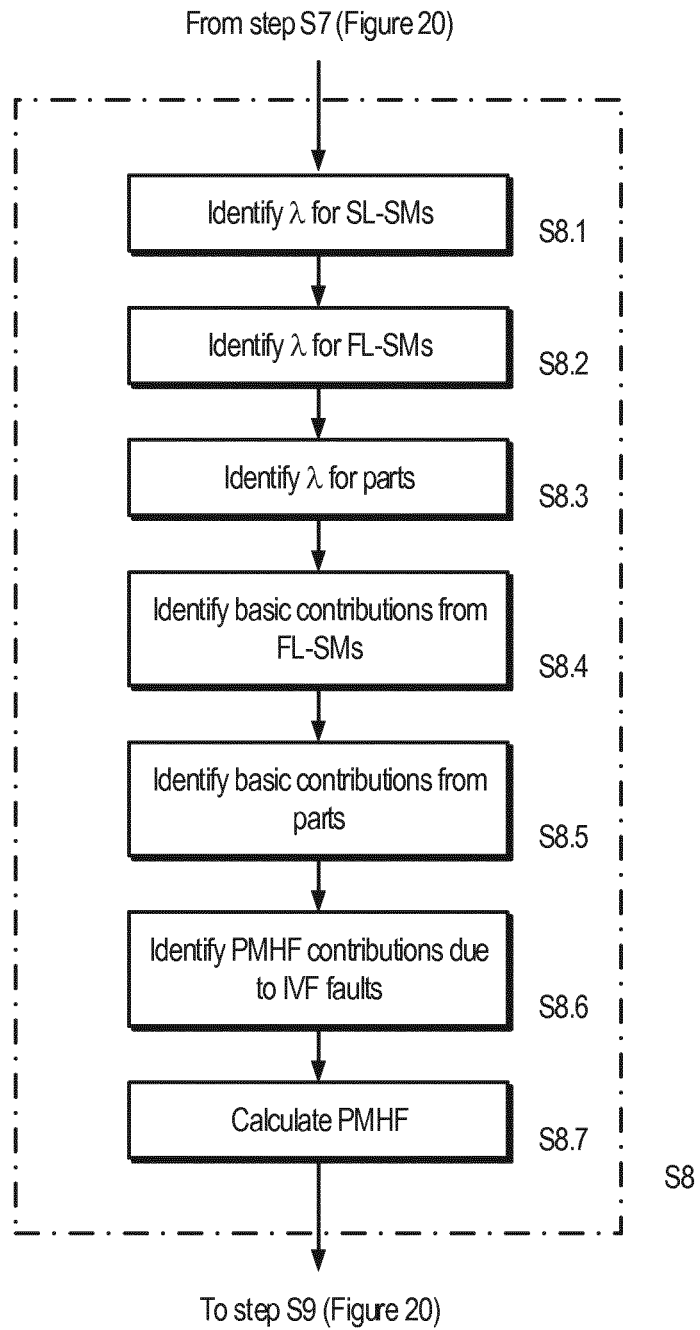
FIG. 10 is a process flow diagram of a method of generating a PHMF value.

Referring to FIG. 10, a process of determining a PMHF value is shown. The process includes deriving values of λ for second layer safety mechanisms (step S8.1), deriving values of λ for first layer safety mechanisms (step S8.2), values of λ for parts (step S8.3), determining basic contributions from first layer safety mechanisms (step S8.4), determining basic contributions from parts (step S8.5 determining PMHF contributions dues to IVF faults (step S8.6) and calculating PMHF (step S8.7).

As hereinbefore described, the actual PMHF evaluation is done using sets of faults that differ from the ones described in Table 2. Before describing the process in detail, a description of the sets of faults will first be described:

TABLE 5

| ID | Actual sets of faults | Description | PMHF contribution | Used descriptive sets |
|---|---|---|---|---|
| 1 | Pa_DVF_U | set of DVF faults in $P_a$ not covered by any SM | $BC_{single}(\lambda_{Pa\_DVF\_U})$ | Pa_DVF_U_U |
| 2 | Pa_DVF_Di | set of DVF faults in $P_a$ detected (and | $BC_{2Layers}(\lambda_{Pa\_DVF\_Di}, \lambda_{FL-SMi\_IVF\_Dj}, \lambda_{SL-SMj}) +$ | Pa_DVF_Di_Dj + Pa_DVF_Di_U |

TABLE 5-continued

| ID | Actual sets of faults | Description | PMHF contribution | Used descriptive sets |
|---|---|---|---|---|
| | | controlled) by FL-SMi which could be (partially) covered by SL-SMj | $BC_{double\_ord}(\lambda_{FL-SMi\_IVF\_U}, \lambda_{Pa\_DVF\_Di})$ | |
| 3 | Pa_DVF_Ci | set of DVF faults in $P_a$ controlled-only by FL-SMi which could be (partially) covered by SL-SMj | $BC_{2Layers}(\lambda_{Pa\_DVF\_Ci}, \lambda_{FL-SMi\_IVF\_Dj}, \lambda_{SL-SMj}) +$ $BC_{double\_ord}(\lambda_{Pa\_DVF\_Ci}, \lambda_{FL-SMi\_IVF\_Dj}) +$ $BC_{double\_unord}(\lambda_{Pa\_DVF\_Ci}, \lambda_{FL-SMi\_IVF\_U})$ | Pa_DVF_Ci_Dj + Pa_DVF_Ci_U |
| 4 | Pa_IVF_U | set of IVF faults in $P_a$ not covered by any SM | $[BC_{single}(\lambda_{Pa\_IVF\_U}) * K_{Pb}]/2$ | Pa_IVF_U_U |
| 5 | Pa_IVF_Di | set of IVF faults in $P_a$ detected by FL-SMi which could be (partially) covered by SL-SMj | $[BC_{2Layers}(\lambda_{Pa\_IVF\_Di}, \lambda_{FL-SMi\_IVF\_Dj}, \lambda_{SL-SMj}) +$ $BC_{double\_ord}(\lambda_{FL-SMi\_IVF\_U}, \lambda_{Pa\_IVF\_Di})] * K_{Pb}/2$ | Pa_IVF_Di_Dj + Pa_IVF_Di_U |
| 6 | Pa_IVF_Ci | set of IVF faults in $P_a$ controlled-only by FL-SMi which could be (partially) covered by SL-SMj | $[BC_{2Layers}(\lambda_{Pa\_IVF\_Ci}, \lambda_{FL-SMi\_IVF\_Dj}, \lambda_{SL-SMj}) +$ $BC_{double\_ord}(\lambda_{Pa\_IVF\_Ci}, \lambda_{FL-SMi\_IVF\_Dj}) +$ $BC_{double\_unord}(\lambda_{Pa\_IVF\_Ci}, \lambda_{FL-SMi\_IVF\_U})] * K_{Pb}/2$ | Pa_IVF_Ci_Dj + Pa_IVF_Ci_U |
| 7 | FL-SMi_DVF_U | set of DVF faults in FL-SMi not detected by any SM | $BC_{single}(\lambda_{FL-SMi\_DVF\_U})$ | FL-SMi_DVF_U |
| 8 | FL-SMi_DVF_Dj | set of DVF faults in FL-SMi detected by SL-SMj | $BC_{double\_ord}(\lambda_{SL-SMj}, \lambda_{FL-SMi\_DVF\_Dj})$ | FL-SMi_DVF_Dj |
| 9 | FL-SMi_IVF_U | set of IVF faults in FL-SMi not detected by any SM | NONE - effect of these faults is taken into account when evaluating contributions due to the part covered by the SM, then no direct contribution to PMHF from them. | FL-SMi_IVF_U |
| 10 | FL-SMi_IVF_Dj | set of IVF faults in FL-SMi detected by SL-SMj | | FL-SMi_IVF_Dj |
| 11 | SL-SM | all faults affecting SL-SMj | NONE - assumption is that a SL-SMj is not able to create a hazard. | SL-SMj |

In Table 5, the last column is meant to help in understanding formulas proposed to evaluate PMHF contributions. It shows which descriptive sets (used in Table 2) make up the actual sets of faults. Furthermore, when an actual set consists of two descriptive sets, the formulas in the fourth are written with two different font styles (normal and italics) to distinguish terms related to different descriptive sets. The same notation is used in the last column to help link formulas and sets, i.e. a formula written in italics in the penultimate column is related to the descriptive set in italics in the last column.

The following steps are built using Table 5 as a reference. If a set of faults is not present in a part (or a FL-SM), then the corresponding portion of FIT and, thus, the associated basic contribution is zero.

Derive λ Derivation for SL-SMs (Step S8.1)

Referring to FIG. 10, the process determines the portion of the FIT associated with the second layer safety mechanisms provided in the design. Because one of the assumptions used to develop the model is that misbehaviours of such a safety mechanism are not able to directly create a hazard, the FIT associated to a given SL-SM (SL-SM$_j$) is added in full to $\lambda_{SL-SMj}$ (steps S8.1.1 to S8.1.7).

Derive λ for FL-SMs (Step S2)

Figure 11:
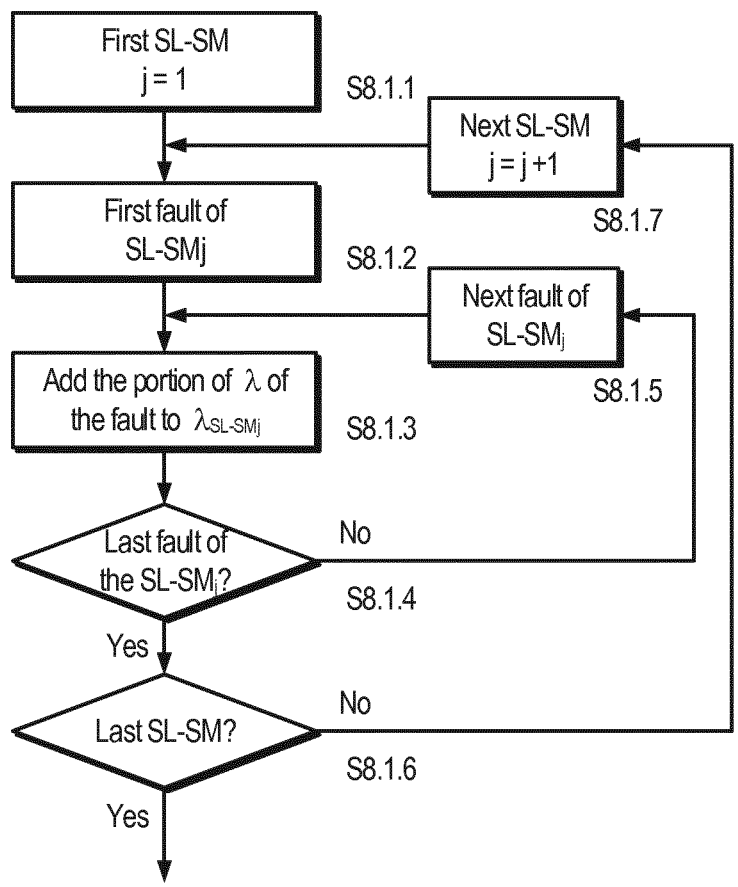
FIG. 11 is a process flow diagram of a method of deriving lambda values SL-SMs.
Figure 19:
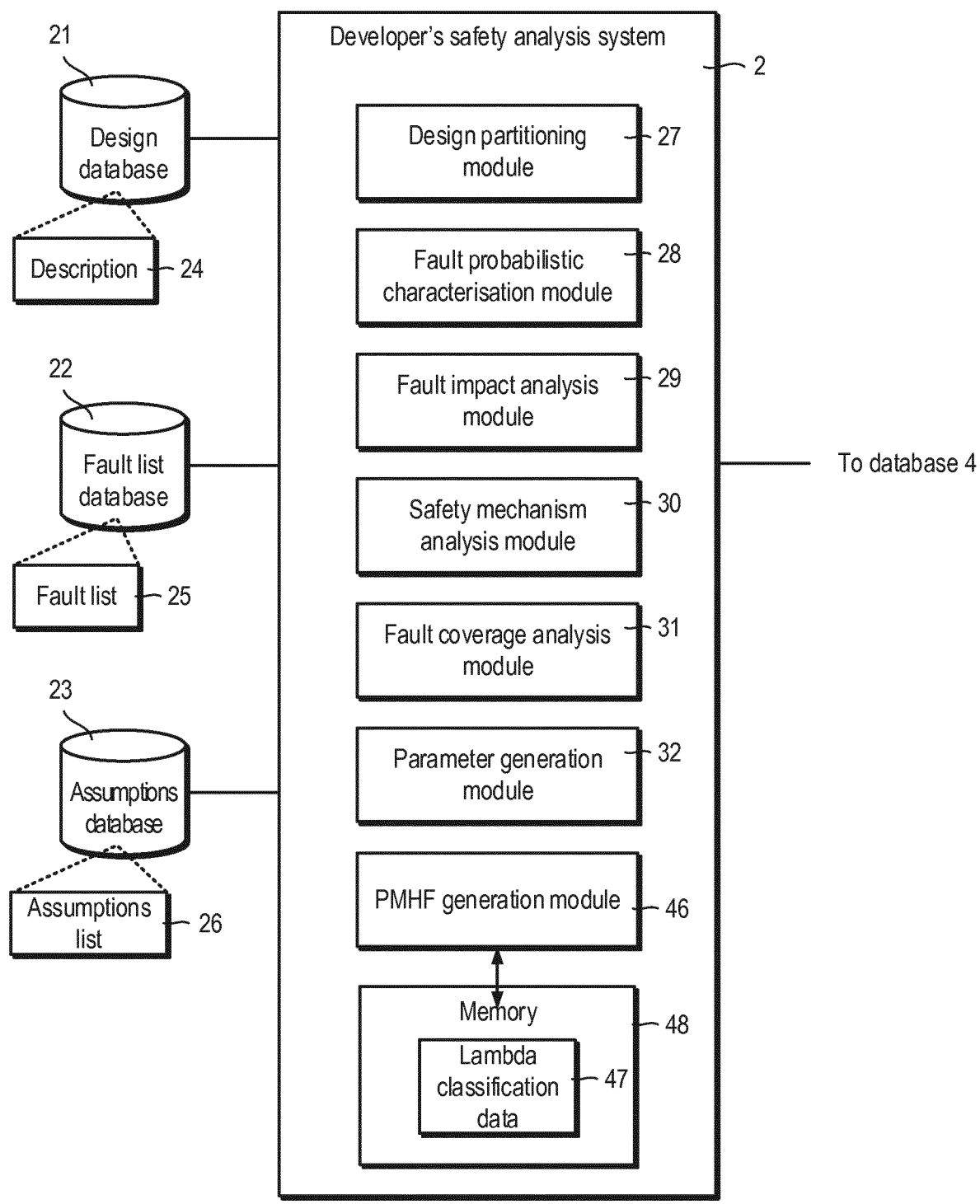
FIG. 19 is a schematic block diagram of a customer safety analysis system.
Figure 20:
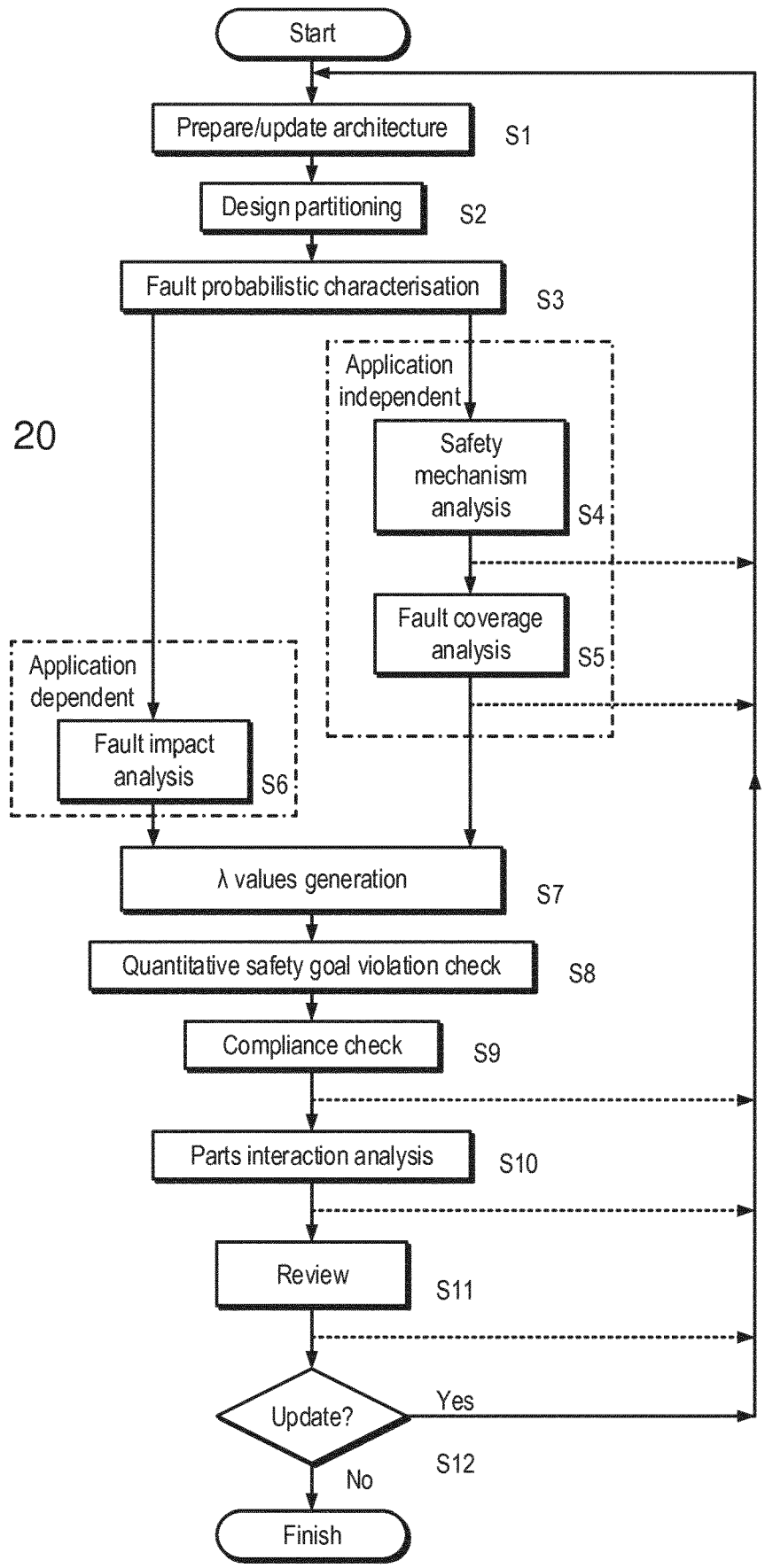
FIG. 20 is a design support process flow diagram.
Figure 22:
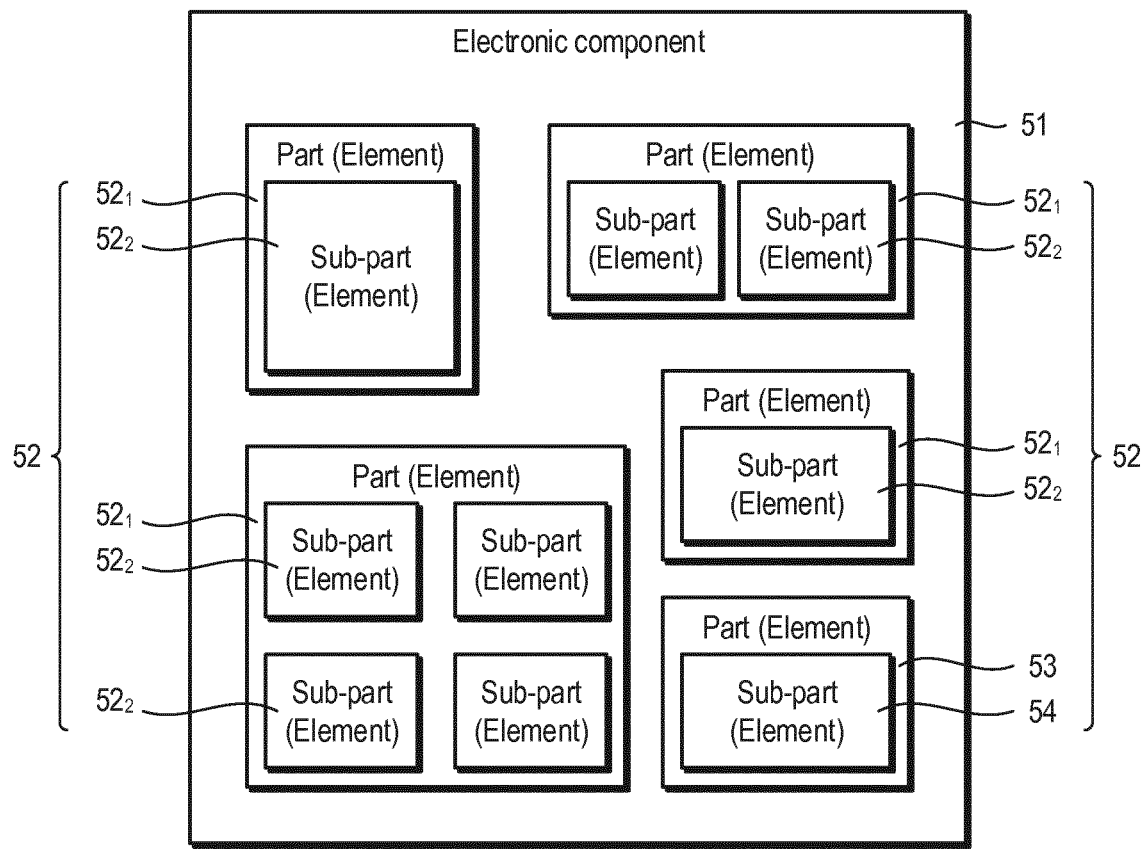
FIG. 22 is a schematic block diagram of an electronic system or component.

Referring to FIG. 11, the process determines the portion of the FIT associated with the first layer safety mechanisms (steps S8.2.1 to S8.2.14). It is a reasonable assumption that at least some of these safety mechanisms have the potential to directly create a hazard. For this reason, a first check is executed on these first layer safety mechanisms to identify a fault affecting a given SM (FL-SMi) is DVF or IVF (step S8.2.3). A second check is carried out to see if the fault is covered by a safety mechanism (step S8.2.4). When a fault is found to be covered by a safety mechanism, a link between the FL-SM and the SL-SM is established (steps S8.2.5 & S8.2.10). This link is stored in lambda classification data 47 (FIG. 19) at least temporarily in working memory 48 (FIG. 19). This link allows for addressing the correct portions of FIT to be used in the formulas when basic contributions are evaluated. When a fault is found to be covered by more than one safety mechanism, the link is issued only with the highest ranked one.

As result of these checks the FIT of the safety mechanism is split in the following different (i.e. disjointed) sets, namely $\lambda_{FL-SMi\_DVF\_U}$, $\lambda_{FL-SMi\_DVF\_Cj}$, $\lambda_{FL-SMi\_IVF\_U}$ and $\lambda_{FL-SMi\_IVF\_Cj}$. Because it is assumed that a second layer safety can only detect faults (and not control them), then there no need to distinguish if a fault in a first layer safety mechanism is control-only or is also capable of detection.

Derive λ for Parts (Step S8.3)

Figure 12:
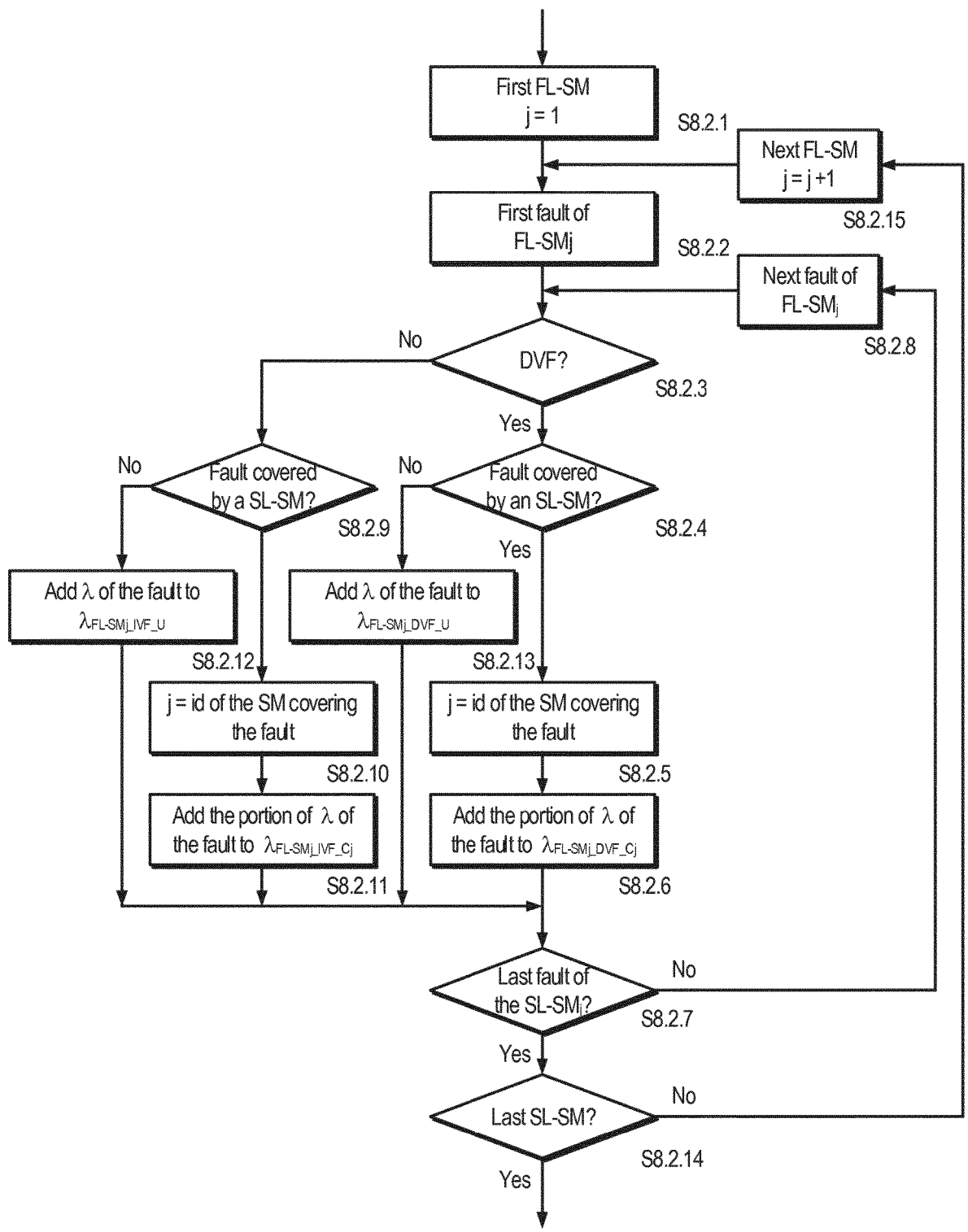
FIG. 12 is a process flow diagram of a method of deriving lambda values for FL-SMs.

Referring to FIG. 12, the process determines the portion of the FIT associated with the parts (steps S8.3.1 to S8.3.18).

Derivation of λ for parts is similar to derivation of λ for first layer safety mechanisms, the main difference being that a distinction is made between faults that are controlled-only and faults that are also detected. Thus, the process checks whether fault is controlled-only (steps S8.3.6 & S8.3.13).

As for derivation of λ for first layer safety mechanisms, a link is created between the part and the safety mechanism cover its faults (steps S8.3.5 & S8.3.12). Similarly, when a fault is found to be covered by more than one safety mechanism, the link is issued only with the highest ranked one.

At the end of this step the following set of λ are available, namely $\lambda_{Pn\_DVF\_U}$, $\lambda_{Pn\_DVF\_Di}$, $\lambda_{Pn\_DVF\_Ci}$, $\lambda_{Pn\_IVF\_U}$, $\lambda_{Pn\_IVF\_Di}$, and $\lambda_{Pn\_IVF\_Ci}$. Steps S1 to S3 can be carried out in a different order and that one or more of the steps may be modified.

Determine Basic Contributions from FL-SMs (Step S8.4)

Figure 13:
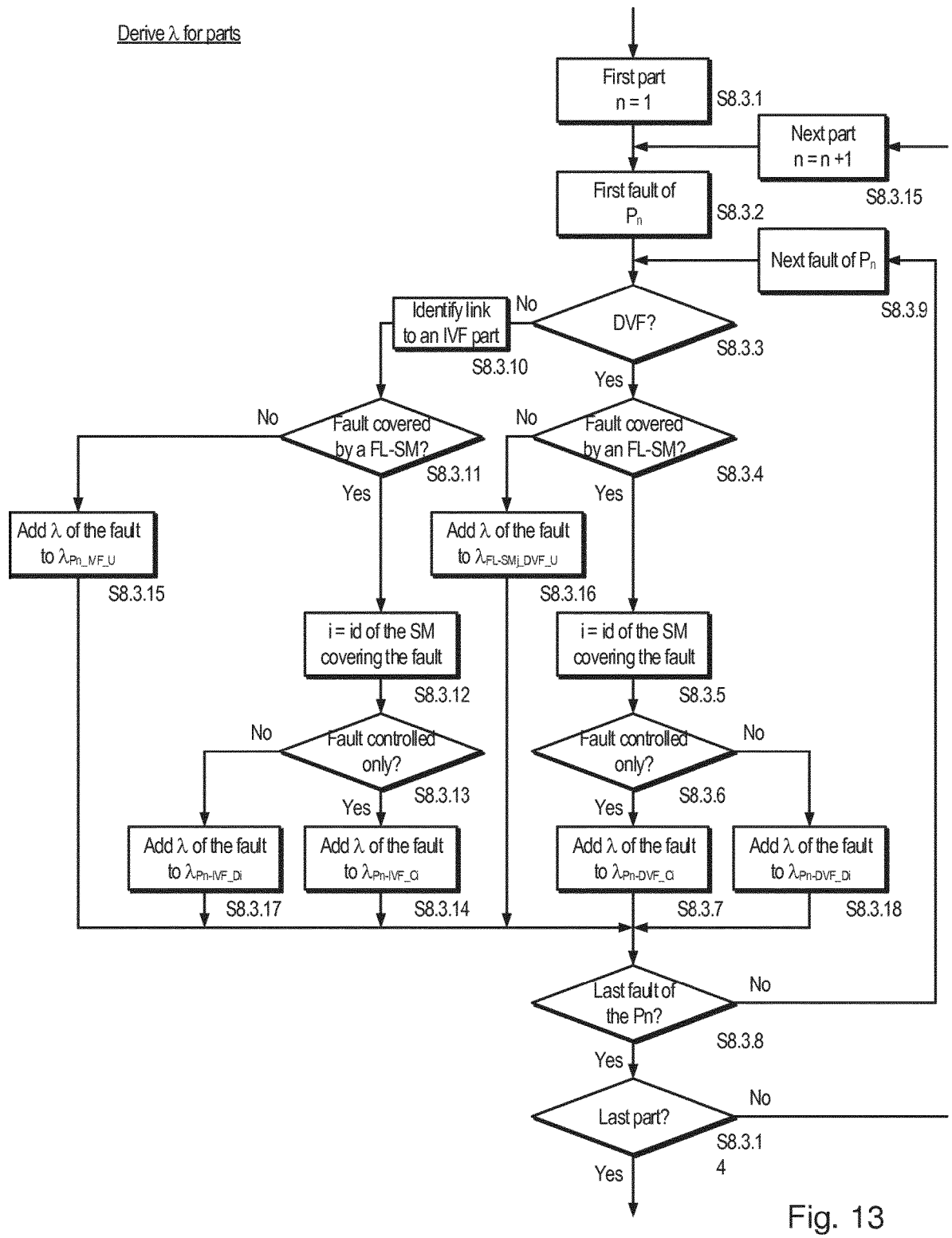
FIG. 13 is a process flow diagram of a method of deriving lambda values for element.

Referring to FIG. 13, once sub-sets of FIT have been derived for the parts and safety mechanisms of the electronic system (such as a microcontroller), the process determines the PMHF contributions due to DVF faults in safety mechanism (steps S8.4.1 to S8.4.4). A contribution due to DVF faults for an $i^{th}$ safety mechanism is labelled $K_{SM\_i}$. If the $i^{th}$ safety mechanism SMi is not affected by DVF faults, then $K_{SM\_i}=0$.

Once $K_{SM\_i}$, is evaluated, it is used directly in the formula for the computation of the PMHF.

According to Table 3, only contribution due to DVF faults are considered for first layer safety mechanisms. The ones due to their IVF faults will be considered directly during the analysis of the parts covered by the safety mechanism itself.

Determine Basic Contributions from Parts (Step S8.5)

Figure 14:
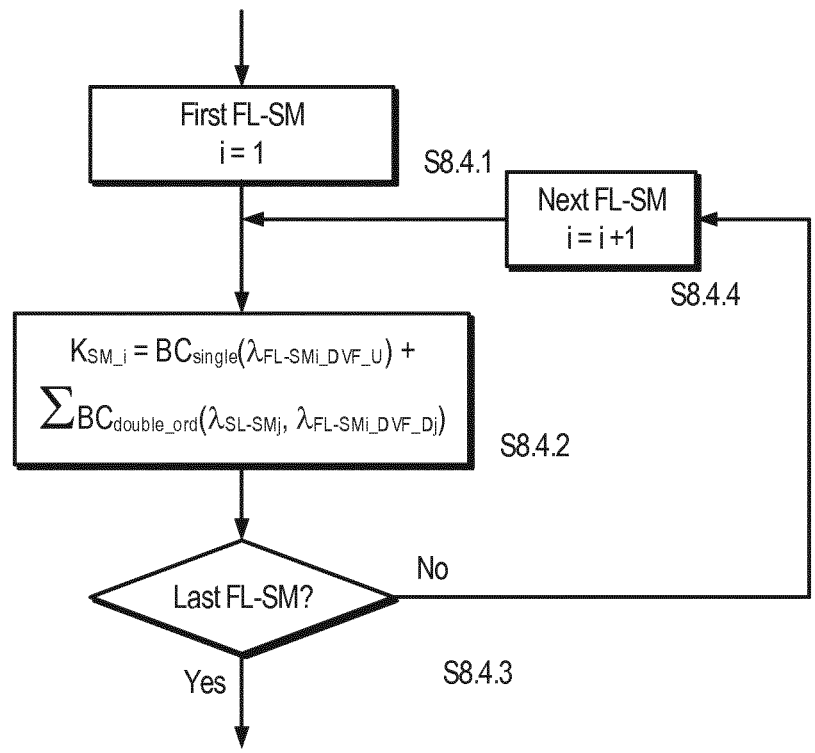
FIG. 14 is a process flow diagram of a method of determining basic contributions from FL-SMs.

Referring to FIG. 14, the process determines contributions to PMHF due to IVF and DVF faults affecting a given part $P_n$ (steps S8.5.1 to S8.5.7).

Outputs of this step are:

$K_{DVF\_n}$: The contribution due to DVF faults; if $P_n$ has no DVF fault then $K_{DVF\_n}=0$; $K_{DVF\_n}$, once evaluated, is used directly in the formula for the computation of the PMHF; and $K_{IVF\_n}$: The contribution due to IVF faults; if $P_n$ has no IVF fault, then $K_{IVF\_n}=0$. Prior to using $K_{IVF\_n}$ in the formula for the computation of the PMHF it is necessary to perform another step of evaluation.

The terms "$\Sigma BC_{double\_unord}(\lambda_{Pn\_IVF\_Ci}, \lambda_{FL\text{-}SMi\_IVF\_U})$" and "$\Sigma BC_{2Layers}(\lambda_{Pn\_IVF\_Di}, \lambda_{FL\text{-}SMi\_IVF\_Dj}, \lambda_{SL\text{-}SMj})$" are evaluated as set out in Formulas 15 and 16 respectively. The sets of FIT used in the example are described in Table 6:

TABLE 6

| ID | Set of FIT | Related to |
|---|---|---|
| 1 | λPn_IVF_U | IVF faults in Pn not covered by any SM |
| 2 | λPn_IVF_C1 | IVF faults in Pn controlled-only by FL-SM1 |
| 3 | λPn_IVF_C2 | IVF faults in Pn controlled-only by FL-SM2 |
| 4 | λPn_IVF_D3 | IVF faults in Pn detected by FL-SM3 |
| 5 | λPn_IVF_D4 | IVF faults in Pn detected by FL-SM4 |
| 6 | λPn_IVF_D5 | IVF faults in Pn detected by FL-SM5 |
| 7 | λFL-SM1_IVF_U | IVF faults in FL-SM1 not detected by any SM |
| 8 | λFL-SM1_IVF_D1 | IVF faults in FL-SM1 detected by SL-SM1 |
| 9 | λFL-SM2_IVF_U | IVF faults in FL-SM2 not detected by any SM |
| 10 | λFL-SM3_IVF_U | IVF faults in FL-SM3 not detected by any SM |
| 11 | λFL-SM3_IVF_D2 | IVF faults in FL-SM3 detected by SL-SM2 |
| 12 | λFL-SM3_IVF_D3 | IVF faults in FL-SM3 detected by SL-SM3 |
| 13 | λFL-SM4_IVF_U | IVF faults in FL-SM4 not detected by any SM |
| 14 | λFL-SM4_IVF_D1 | IVF faults in FL-SM4 detected by SL-SM1 |
| 15 | λFL-SM5_IVF_U | IVF faults in FL-SM5 not detected by any SM |
| 16 | λSL-SM1 | all faults affecting SL-SM1 |
| 17 | λSL-SM2 | all faults affecting SL-SM2 |
| 18 | λSL-SM3 | all faults affecting SL-SM3 |

$$\Sigma BC_{double\_unord}(\lambda_{Pn\_IVF\_Ci}, \lambda_{FL\text{-}SMi\_IVF\_U}) = \\ BC_{double\_unord}(\lambda_{Pn\_IVF\_C1}, \lambda_{FL\text{-}SM1\_IVF\_U}) ++ \\ BC_{double\_unord}(\lambda_{Pn\_IVF\_C2}, \lambda_{FL\text{-}SM2\_IVF\_U}) \quad (15)$$

$$\Sigma BC_{2Layers}(\lambda_{Pn\_IVF\_Di}, \lambda_{FL\text{-}SMi\_IVF\_Dj}, \lambda_{SL\text{-}SMj}) \\ = BC_{2Layers}(\lambda_{Pn\_IVF\_D3}, \lambda_{FL\text{-}SM3\_IVF\_D2}, \\ \lambda_{SL\text{-}SM2}) ++ BC_{2Layers}(\lambda_{Pn\_IVF\_D3}, \lambda_{FL\text{-}SM3\_IVF\_D3}, \\ \lambda_{SL\text{-}SM3}) ++ BC_{2Layers}(\lambda_{Pn\_IVF\_D4}, \lambda_{FL\text{-}SM4\_IVF\_D1}, \\ \lambda_{SL\text{-}SM1}) \quad (16)$$

Determining PMHF Contribution Due to IVF Faults (Step S8.6)

Figure 15:
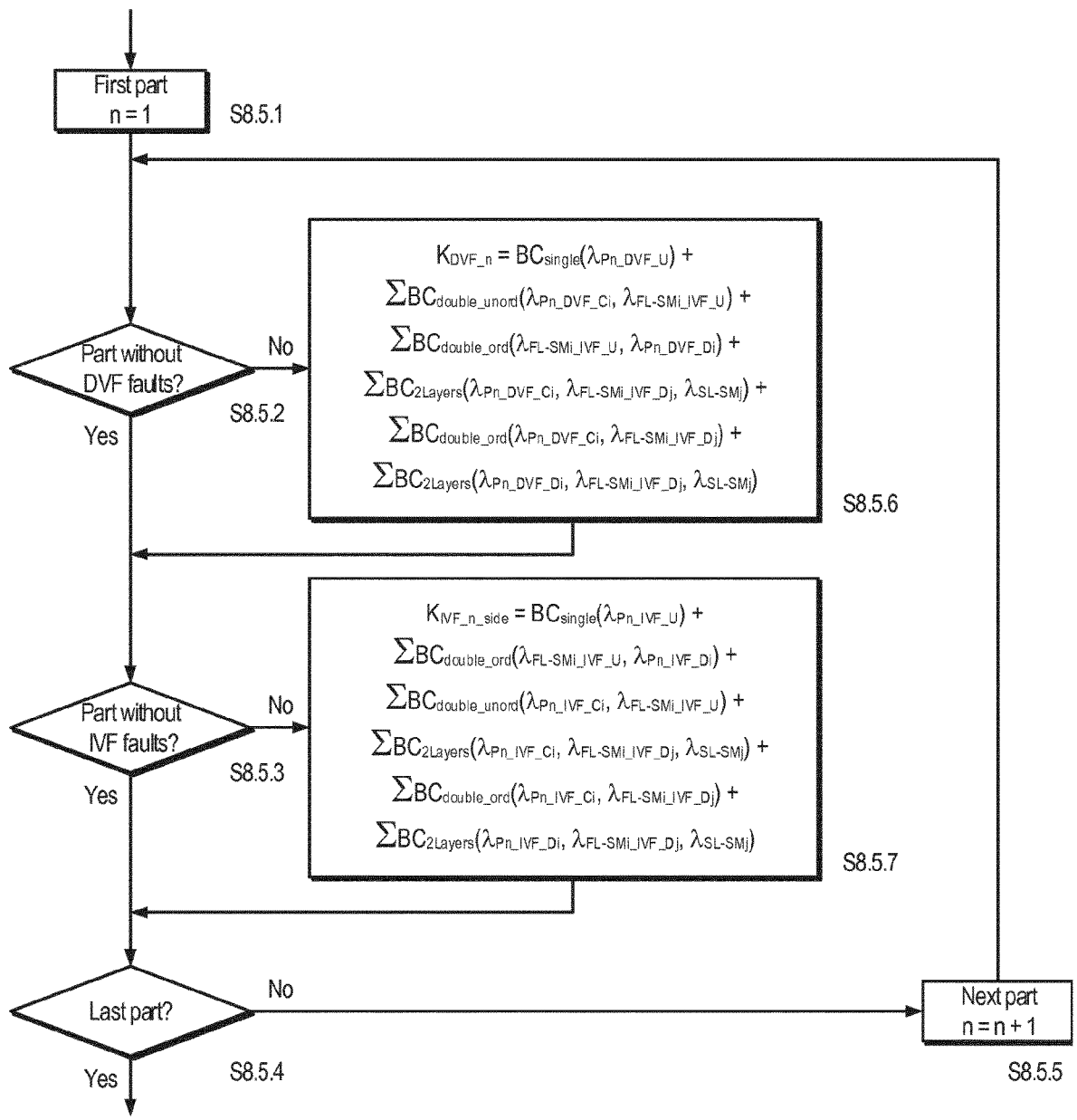
FIG. 15 is a process flow diagram of a method of determining basic contributions from parts.

Referring to FIG. 15, the process determines contributions to PMHF due to IVFs (steps S8.6.1 to S8.6.7). In the case of IVFs, each of two concurrent parts are identified to evaluate properly the PMHF contribution. A first part $P_A$ is concurrent with a second part $P_B$ if IVFs affecting $P_A$ are needed in order that IVFs in $P_B$ lead to a violation of a safety goal. Concurrency is commutative so that if the first part $P_A$ is concurrent with the second part $P_B$, then the second part $P_B$ is concurrent with the first part $P_A$.

This step determines whether a part provides a safety mechanism and adjust the contribution according to whether the part provides a safety mechanism or not. If the part does not provide a safety mechanism, then there is no contribution; if the part does provide a safety mechanism then the contribution is reduced by a factor of 0.5.

Figure 18:
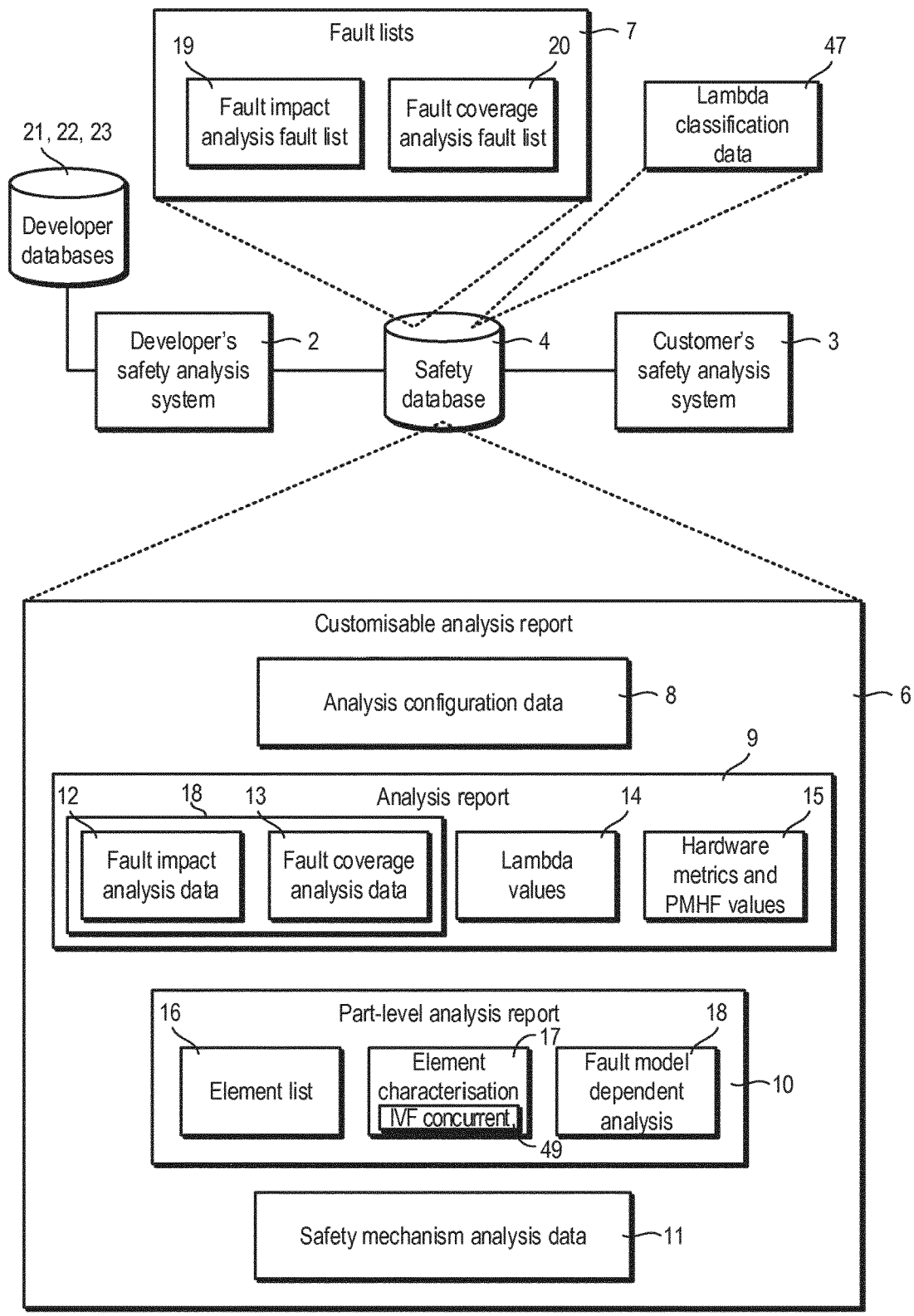
FIG. 18 is a schematic block diagram of a design support system including a safety database which stores a customisable analysis report.

In the safety analysis process, IVF concurrent parts are identifiable using a "IVF_concurrent" attribute 49 in element characterisation 17 (FIG. 21) of part-level analysis report 10 (FIG. 18).

In some cases, it may not be possible to identify a concurrent part. For example, if fault impact is manually estimated, then it is assumed that a fault cannot create a hazard on its own and, in a conservative way, if the fault is not categorized as NVF, then the fault becomes IVF. For such cases, the process allows for the identification of a "worst IVF part", in short, $P_g$, of the design.

The process first derives $K_{Pg}$ (step S8.6.1) which is the contribution of all the IVF faults affecting the part and which is considered to be one of the independent branches needed to evaluate the contribution to the PMHF due to IVF faults.

The process then selects $P_g$ being, among the $P_n$ parts with IVF faults and blank "IVF_concurrent" attribute, the one with the highest $K_{IVF\_n}$ (steps S8.6.3 & S8.6.4). Faults in part $P_g$ are then considered to be concurrent with the IVF faults whose parent part has a blank entry in "IVF_concurrent" attribute (step S8.6.3)

There are two possibilities, namely (1) the part is clearly linked to another part through the attribute "IVF_concurrent" 17 (FIG. 21) in element characterisation 17 (FIG. 21); or (2) the part is not linked to any other parts and its related attribute "IVF_concurrent" 17 (FIG. 21) in element characterisation 17 (FIG. 21) is left blank.

In the first case, the calculation is straight forward and it is only needed to combine the basic contributions, evaluated during the previous step, of the two concurrent parts (steps S8.6.3, S8.6.8 and step S8.6.10; marked by arrow A). In the second case, evaluation of the contribution to the PMHF requires an additional step, namely selection of the "worst IVF part" (step S6.1).

For a part with a blank "IVF_concurrent" attribute 17 (FIG. 21) in element characterisation 17 (FIG. 21), $K_{IVF\_n}$ will be calculated associating $P_n$ to the worst IVF part $P_g$ (whose selection will be given later on). Otherwise, the concurrent branch is evaluated following the link expressed in the "IVF_concurrent" attribute 17 (FIG. 21) in element characterisation 17 (FIG. 21).

The check "n=g?" (step S8.6.4) allows for skipping the contribution due to IVF faults affecting the part if the part under analysis is the one classified as "worst IVF part".

The reason for introducing this step will now be explained.

Analysis of $P_g$ should provide the contribution:

$$K_{IVF\_g} = \sum_{all\_possible\_g^*} 0.5 \cdot K_{IVF\_g\_side} \cdot K_{IVF\_g^*} = \sum_k 0.5 \cdot K_{Pg} \cdot K_{IVF\_g\_side}$$

where values of k are such that $P_K$ is a part linked to $P_g$, while each one of the part associated to $P_g$ should provide $$K_{IVF\_k} = 0.5 \cdot K_{IVF\_k\_side} \cdot K_{IVF\_k^*} = 0.5 \cdot K_{IVF\_k\_side} \cdot K_{Pg}$$

So that the overall contribution of $P_g$ and all the parts associated to it can be easily found, $K_{Pg\_Pk}$ is:

$$K_{Pg\_Pk} = K_{IVF\_g} + \sum_k K_{IVF\_k} = \sum_k K_{Pg} \cdot K_{IVF\_k\_side}$$

To evaluate $K_{Pg}$, the process should ideally keep track of every part associated to $P_g$. This, however, requires processing resources. Thus, an easier solution can be used whereby the overall $K_{Pg\_Pk}$ is simply estimated. Because of the check "n=g?" the adopted solution provides a $K'_{IVF\_g}=0$, while following a series of steps S6.4 & S6.9 (marked by arrow B), it gives:

$$K'_{IVF\_k} =$$
$$K_{IVF\_k\_side} = \frac{K_{IVF\_k\_side} \cdot K_{IVF\_k^*}}{2} = \frac{K_{IVF\_k\_side} \cdot 2 \cdot K_{Pg}}{2} = K_{IVF\_k\_side} \cdot K_{Pg}$$

The overall contribution of $P_g$ and all the parts associated to it evaluated with this different approach ($K'_{Pg\_Pk}$) can be calculated to be exactly equal to the one previously calculated, namely:

$$K'_{Pg\_Pk} = K'_{IVF\_g} + \sum_k K'_{IVF\_k} = 0 + \sum_k K_{IVF\_k\_side} \cdot K_{Pg} = K_{Pg\_Pk}$$

Calculating PMHF (step S8.7)

Figure 16:
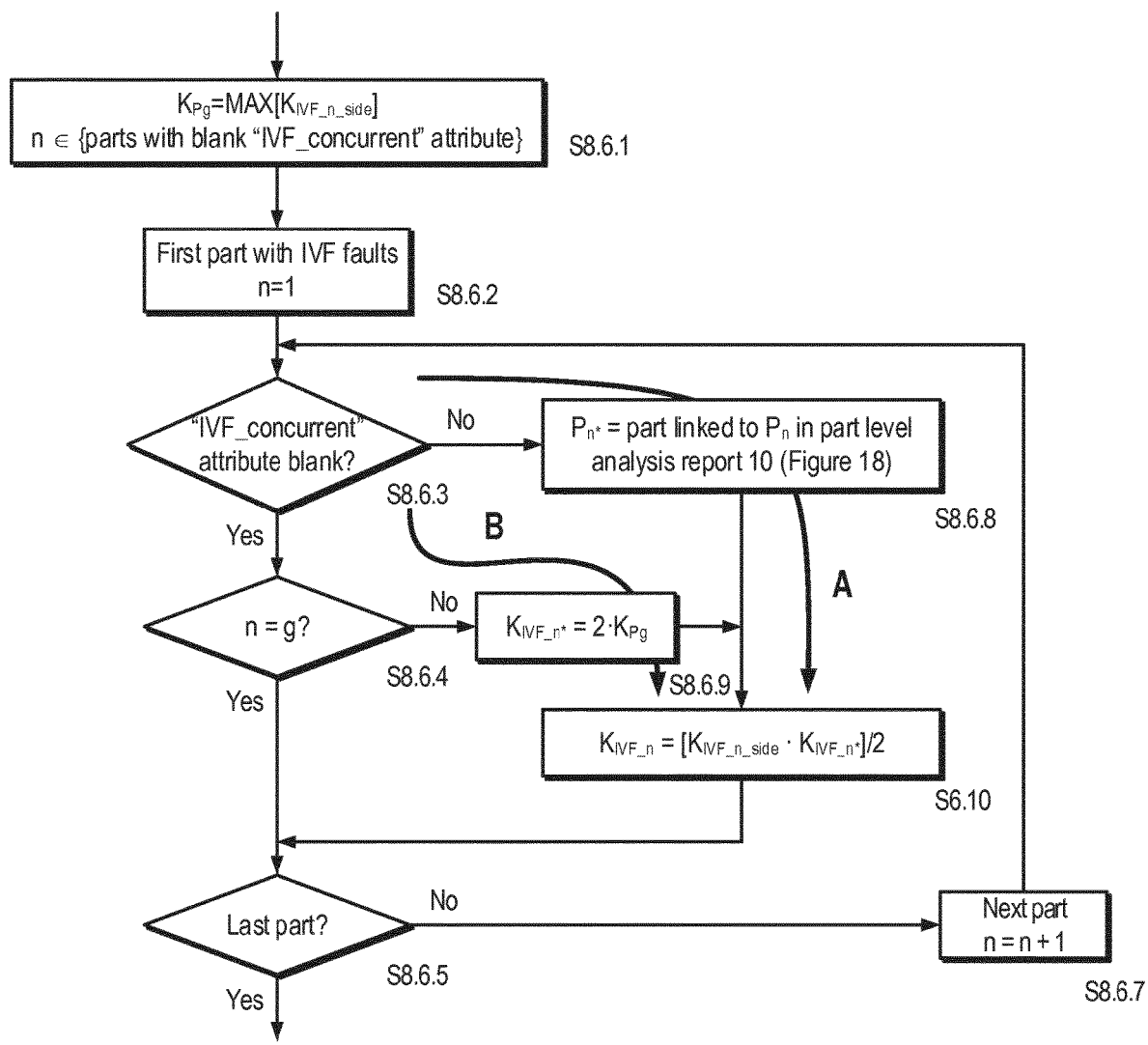
FIG. 16 is a process flow diagram of a method of determining a PMHF contribution due to IVF faults.

Referring to FIG. 16, the process calculates the PMHF (step S8.7). This done by summing all the contributions $K_{SM\_i}$, $K_{DVF\_n}$ and $K_{IVF\_ne}$.

Design Support System 1

Figure 17:
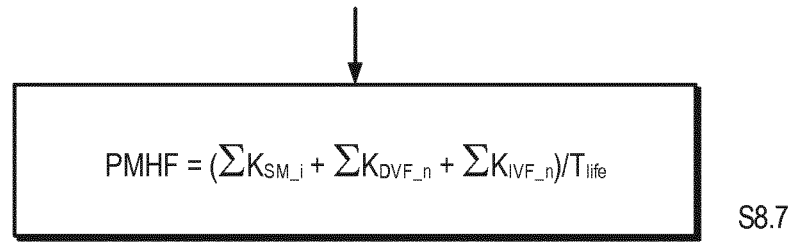
FIG. 17 illustrates determining the PMHF.

Referring to FIG. 17, a design support system 1 for generating functional safety data for an electronic component, such as a microcontroller, is shown.

The design support system 1 includes a developer safety analysis system 2, a customer safety analysis system 3 and a shared database 4 that stores safety data including a customisable analysis report 6 and fault lists 7 which are used to prepare the customisable analysis report 6.

The customisable analysis report 6 includes analysis configuration data 8, an analysis report 9, a part-level analysis report 10 and a safety mechanism report 11. The analysis report 9 includes fault impact analysis data 12, fault coverage analysis data 13, lambda values 14 and hardware metric values and probabilistic metric for random hardware failure (PMHF) values 15. The part-level analysis report 10 includes a list of elements 16, element characterisation data 17 and fault dependent analysis 18. As shown in FIG. 18, the fault dependent analysis 18 comprises fault impact analysis data 12 and fault coverage analysis data 13. The fault lists 7 include a fault impact analysis fault list 19 and a fault coverage analysis fault list 20. The customisable analysis report 6 and/or fault lists 7 may be stored in the forms of a set of tables.

The fault impact analysis data 12 and fault coverage analysis data 13 need not be included in the analysis report 9. Likewise, the fault impact analysis data 12 and fault coverage analysis data 13 need not be included in the part-level analysis report 10.

The fault impact analysis data 12 and fault coverage analysis data 13 can be stored separately from the analysis report 9 and/or part-level analysis report 10. The fault impact analysis data 12 and fault coverage analysis data 13 can be duplicated (e.g. by mirroring) and stored in one of or both the analysis report 9 and/or part-level analysis report 10.

The design support system 1 also includes a set of developer databases 21, 22, 23.

Lambda classification data 47 may be stored in the safety database 4. The lambda classification data 47 may be included in the customisable analysis report 6.

A developer can generate the customisable analysis report 6 when designing an electronic component, such as a microcontroller. The developer and/or the customer may change the analysis configuration data 8, fault impact analysis data 12 and fault coverage 13 and inspect the effect of doing so on the lambda values 14 and hardware metric values and PMHF values 15.

Some parts of the customisable analysis report 6 may be visible to the developer, but not the customer. Some parts of the customisable analysis report 6 may be visible, but not changeable by the customer. Some parts of the customisable analysis report 6 may be changeable by the customer, but the customer may be limited to making changes to values lying in ranges or having specific values specified by the developer. Limiting the customisable analysis report 6 in one or more of these ways can help to prevent the customer from making unexpected or invalid changes.

The design support system 1 may take the form of a database and a database management system. The customisable analysis report 6 may be stored in the form of spreadsheets and text files.

FIG. 19 illustrates the developer side of the design support system 1 in more detail.

Referring to FIG. 19, the design support system 1 includes a set of developer databases 21, 22, 23 including a design database 21, a fault list database 22 and an assumptions database 23. The design database 21 stores a description 24 of a design of an electronic component, for example in the form of a pre-layout, gate level net list which includes size information. However, the description 24 may include additional information about layout, such as distance between logic blocks. Layout information may be used to identify bridge faults. The description 24 may include information at a higher or lower level of abstraction. The description 24 may include information from more than one level of abstraction.

The fault list database 22 stores a list of possible faults 25. The fault list 25 may take the form of a table, for example in a spreadsheet or text file, listing possible faults, such as "stuck at 0" or "stuck at 1".

The assumptions database 23 stores assumptions 26 about how the electronic component will be used. The assumptions 26 may take the form of a table, for example a spreadsheet or text file, listing assumptions, such as "Assumption 1: System is using an external watchdog that will generate a reset if not cleared every 10 milliseconds".

The developer safety analysis system 2 includes modules 27, 27, 29, 30, 30, 32, 46 for generating the customisable analysis report 6. The developer safety analysis system 2 includes a design partitioning module 27, a fault probabilistic characterisation module 28, a fault impact analysis module 29, a safety mechanism analysis module 30, a fault coverage analysis module 31, a safety parameter generation module 32 and a PMHF generation module 46.

The design support system 1 allows a developer and customer to collaborate during development of an electronic component. Using the system 1 and the processes described herein, a systematic approach can be followed to quantify the safety capabilities of an electronic component and assess its development. The design support system 1 can speed up process of designing the electronic component.

FIG. 21 shows element characterisation data 17 in more detail.

Referring to FIG. 21, the element characterisation data 17 includes a set of entries 70 for elements, each entry 70 including a first attribute field 71 containing an element identifier (ID) and a second attribute field 72 containing an element name, a third attribute field 73 containing an indicator marking whether or not a part is relevant to safety, a fourth attribute field 74 containing a fault characterisation name, a fifth attribute field 75 35 containing a failure rate characteristic name and a sixth attribute field 49 containing the identifier or name of another element to which the element is linked or, if there is no link, the attribute is flagged as such (herein referred to being as "blank"), for example, by being set to a null value or a dummy value.

The element characterisation data 17 can also include size information relating to the element.

The element characterisation data 17 is stored in the safety database 4 (FIG. 18) as a section in the part-level analysis report 10.

Overview of Safety Analysis

Referring to FIGS. 18, 19, 20 and 22, an overall approach to analysing functional safety capabilities of an electronic component is shown. Herein, the example of a microcontroller will be used. However, the approach may be applied to other types of integrated circuits such as system-on-a-chip (SoC), memory, application-specific integrated circuit (ASIC), analog IC, mixed signal IC and power IC, as well as other electronic components. The approach may be applied to electronic systems which comprise a plurality of electronic components.

A design 51 for an electronic component, in this example a microcontroller, is prepared (step S1).

The design 51 is partitioned to define elements 52 which include parts 52$_1$, such as CPU cores, embedded memory and communication units, and sub-parts 52$_2$, such as macros and digital standard cell blocks (step S2).

Once the elements 52 have been identified, physical defects with the potential to affect each element 52 are identified and each element 52 is characterised by allocating a failure rate, measured in units of failures in time (FIT) (which is the number of failures expected per 109 device-hours of operation), to the element 52, by assigning one or more fault models to the element 52 and, if there is more than one fault model, by assigning a distribution of a failure rate between the different fault models (step S3).

Safety mechanisms, such as self-checking logic or loop back logic, embedded in the microcontroller or which are assumed to be outside the microcontroller, are identified and their properties are investigated (step S4). As will be explained in more detail later, a safety mechanism can be implemented fully in hardware, fully in software or using both hardware and software, or be provided outside the microcontroller. Once the safety mechanisms have been identified, the overall effectiveness of safety mechanisms is determined (step S5).

Independent of any consideration of safety mechanisms, the impact of faults on elements 52 is determined (step S6). As will be explained in more detail later, assumptions about the usage of the microcontroller can be made.

Once fault coverage and fault impact have been evaluated, fault classification is undertaken which yields failure rates and hardware metrics for the microcontroller (step S7).

The results 14, 15 are output in a report 6 and stored in the safety database 4. As will be described in more detail later, the report 6 is customisable. The developer and/or customer can change input parameters to see how the results 14, 15 change.

Probability of safety goal violations due to random hardware failures can be evaluated (step S8). As explained earlier, values of PMHF can be obtained using FMEA-like analysis.

A check can be made of results compliance against quantitative targets (step S9). This includes checking hardware metrics values and probabilistic metric for random hardware failure (PMHF)/cut-set methods against defined targets to check for plausibility and compliance. Interaction between on-chip modules can be analysed (step S10).

A review of the safety analysis, hardware metric values and PMHF/cut-set results is made (step S11). The design may be updated (step S12) and the process repeated until a satisfactory design is realized.

Further details of the system can be found in EP 2 757 476 A2 which is incorporated herein by reference. Like features herein and in EP 2 757 476 A2 are denoted by like reference numerals.

MODIFICATIONS

It will be appreciated that various modifications may be made to the embodiments hereinbefore described. Such modifications may involve equivalent and other features which are already known in the design, manufacture and use of safety analysis systems and component parts thereof and which may be used instead of or in addition to features already described herein. Features of one embodiment may be replaced or supplemented by features of another embodiment.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. A method of determining a probabilistic metric for random hardware failure for an electronic system which comprises elements and safety mechanisms, the safety mechanisms including first layer safety mechanisms and second layer safety mechanisms, wherein a first layer safety mechanism may provide at least partial coverage of failure of a part and a second layer safety mechanism provides at least partial coverage of failure of a first layer safety mechanism, the method comprising:

calculating a first set of probabilities associated with the first layer safety mechanisms, wherein calculating the first set of probabilities comprises, for each first layer safety mechanism:

calculating a contribution due to a direct violation fault in a first layer safety mechanism and contributions due to combinations of a first fault occurring in a second layer safety mechanism and a later second, direct violation fault occurring in the first level safety mechanism, wherein the direct violation fault in the first layer safety mechanism is covered by the second layer safety mechanism;

calculating a second set of probabilities associated with direct violation faults in the parts;

calculating a third set of probabilities associated with indirect violation faults in the parts; and obtaining the value of probabilistic metric for random hardware failure in dependence on the first, second and third sets of probabilities.

2. The method of claim 1, wherein obtaining the value of probabilistic metric for random hardware failure includes adding the first, second and third sets of probabilities.

3. The method of claim 2, wherein obtaining the value of probabilistic metric for random hardware failure includes dividing by an estimated life time of the system.

4. The method of claim 1, further comprising:

identifying a fourth set of probabilities associated with the second layer safety mechanisms, wherein obtaining the value of probabilistic metric for random hardware failure including adding the first, second, third and fourth sets of probabilities or wherein the first and second sets of probabilities include the fourth set of probabilities.

5. The method of claim 1, wherein the value probabilistic metric for random hardware failure is obtained in accordance with parts 1 to 10 of the $1^{st}$ edition of ISO 26262 standard.

6. The method of claim 1, further comprising, for each first layer safety mechanism:

determining whether a fault affecting a first layer safety mechanism is a direct violation fault or an indirect violation fault;

determining whether the fault is covered by a second layer safety mechanism; and in dependence upon the fault being covered by the second layer safety mechanism, establishing a link between the first layer safety mechanism and the second layer safety mechanism.

7. The method of claim 1, further comprising, for each element:

determining whether a fault affecting an element is a direct violation fault or an indirect violation fault;

determining whether the fault is covered by a first layer safety mechanism; and in dependence upon the fault being covered by the first layer safety mechanism, establishing a link between the part and the first layer safety mechanism.

8. The method of claim 1, wherein calculating the second set of probabilities comprises, for each part:

determining whether the part has one or more direct violation faults and, upon a positive determination, calculating a contribution due to the direct violation fault(s); and determining whether the part has one or more indirect violation faults and, upon a positive determination, calculating a contribution due to indirect violation fault(s).

9. The method of claim 1, wherein calculating the second set of probabilities comprises:

summing probabilities for a set of different fault and safety mechanism failure scenarios caused by direct violation fault(s).

10. The method of claim 1, wherein calculating the second set of probabilities comprises:

summing probabilities for a set of different fault and safety mechanism failure scenarios caused by indirect violation fault(s).

11. The method of claim 1, wherein calculating the third set of probabilities comprises, for each part:

determining whether the part is linked to another part;

determining a contribution to the probabilistic metric for random hardware failure due to indirect violation faults for the part and the other part.

12. The method of claim 1, wherein the electronic system is an integrated circuit or a plurality of electronic components.

13. A method of generating functional safety data for a design of an electronic system which comprises a plurality of elements, the method comprising:

receiving configuration data which includes fault-related data and analysis-related data;

receiving fault impact analysis data comprising data indicative of impact of one or more faults on an output of each element;

receiving fault coverage analysis data comprising data indicative of an extent to which each element is covered by safety mechanism(s);

generating functional safety data using the configuration data, the fault impact analysis data and the fault coverage analysis data;

determining a probabilistic metric for random hardware failure using a method according to any preceding claim; and storing a report including the configuration data, the fault impact analysis data, the fault coverage analysis data and the functional safety data.

14. A method of designing an electronic component, the method including:

preparing a design of the electronic component;

generating functional safety data according to claim 13 for a first design of the electronic component;

preparing a revised design of the electronic component in dependence upon the functional safety data.

15. A method of fabricating an electronic component, the method comprising:

designing an electronic component according to claim 14; and fabricating an electronic component according to the revised design.

16. An electronic component fabricated by a method according to claim 15.

17. A computer program product comprising a non-transitory computer-readable medium storing a computer program which, when executed by data processing apparatus, causes the data processing apparatus to perform the method of claim 1.

18. A design support system which includes data processing apparatus comprising:

at least one processor; and memory;

wherein the least one processor is configured to perform the method of claim 1.

\* \* \* \* \*